United States Patent [19]

Kondo

[11] Patent Number: 5,691,394
[45] Date of Patent: Nov. 25, 1997

[54] PHOTOPOLYMERIZABLE COMPOSITION CONTAINING A SENSITIZING DYE AND A TITANOCENE COMPOUND

[75] Inventor: Syunichi Kondo, Shizuoka, Japan

[73] Assignee: Fuji Photo Film Co., Ltd., Minami-Ashigara, Japan

[21] Appl. No.: 598,005

[22] Filed: Feb. 7, 1996

[30] Foreign Application Priority Data

Feb. 9, 1995 [JP] Japan ................................. 7-20852

[51] Int. Cl.$^6$ ....................................... C08F 2/50
[52] U.S. Cl. .................... 522/29; 522/16; 522/24; 522/25; 522/26; 522/27; 522/28; 430/281.1; 430/278.1
[58] Field of Search .................... 522/16, 29, 26, 522/28, 24, 27, 25

[56] References Cited

U.S. PATENT DOCUMENTS

| | | |
|---|---|---|
| 5,008,302 | 4/1991 | Hüsler et al. . |
| 5,011,755 | 4/1991 | Rohde et al. . |
| 5,049,481 | 9/1991 | Okamoto et al. ................ 430/283 |
| 5,498,641 | 3/1996 | Urano et al. ................ 552/26 |
| 5,573,889 | 11/1996 | Hofmann et al. ................ 430/285.1 |

*Primary Examiner*—George F. Lesmes
*Assistant Examiner*—Cheryl Juska
*Attorney, Agent, or Firm*—Burns, Doane, Swecker & Mathis, LLP

[57] ABSTRACT

A photopolymerizable composition is disclosed, comprising an addition polymerizable compound having at least one ethylenically unsaturated double bond, a sensitizing dye represented by formula (I) and a titanocene compound. The photopolymerizable composition exhibits high sensitivity to active light rays over a wide region of from ultraviolet light to visible light.

16 Claims, No Drawings

PHOTOPOLYMERIZABLE COMPOSITION CONTAINING A SENSITIZING DYE AND A TITANOCENE COMPOUND

FIELD OF THE INVENTION

The present invention relates to a photopolymerizable composition, more particularly, it relates to a photopolymerizable composition highly sensitive to light rays in the visible light region and capable of showing good sensibility also to an Ar$^+$ laser, YAG-SHG laser or the like light source.

BACKGROUND OF THE INVENTION

A large number of image formation methods using a photopolymerization system have been conventionally known and used over a wide range of fields such as printing plate, printed circuit, paint, ink, hologram recording and three-dimensional formation. For example, there are known a method where a photopolymerizable composition comprising an addition-polymerizable compound having an ethylenic double bond and a photopolymerization initiator, further, if desired, an organic high molecular binder and a thermal polymerization inhibitor is provided on a support to form a film layer, the layer is image exposed to a desired image to cure the exposed area by polymerization and then the unexposed area is removed by dissolution to form a cured relief image, a method where a layer comprising the above-described photopolymerizable composition is provided between two supports, with at least one support being transparent, the layer is image exposed from the transparent support side to induce change in the adhesive strength due to light and then the support is peeled off, a method where a photosensitive material having a microcapsule layer containing a photopolymerizable composition and a coloring material such as a leuco dye is prepared, the photosensitive material is image exposed to photocure capsules on the exposed area, capsules on the unexposed area are ruptured by pressure or heat treatment, the coloring material dissolved out comes in contact with the coloring material developer to effect coloration to thereby form a colored image, an image formation method using the change in toner adhesion of the photopolymerizable composition due to light and an image formation method using the change in refractive index of the photopolymerizable composition.

The photopolymerizable composition applied to these methods uses in many cases benzene, benzoin ether, Michler's ketone, anthraquinone, acridine, phenazine or benzophenone as a photopolymerization initiator. However, these photopolymerization initiators are extremely low in the photopolymerization initiation ability to visible light of 400 nm or more as compared with the photopolymerization initiation ability to ultraviolet light of 400 nm or less and accordingly, they are conspicuously limited in their application range.

Recently, as the image formation technique has been developed, a photopolymer having high sensibility to light rays in the visible region is being demanded. The photopolymer is, for example, a photosensitive material suitable for non-contact type plate making using projection exposure or for plate making using a visible light laser. The promising visible laser includes an Ar laser which emits light of 488 nm and a YAG-SHG laser which emits light of 532 nm.

With respect to the photopolymerization initiation system sensible to light rays in the visible region, many proposals have hitherto been made. Examples of the system include a certain kind of photosensitive dye described in U.S. Pat. No. 2,850,445, a composite initiation system comprising a dye and an amine (see, JP-B-44-20189 (the term "JP-B" as used herein means an "examined Japanese patent publication")), a combination use system comprising hexaarylbiimidazole, a radical generating agent and a dye (see, JP-B-45-37377), a system comprising hexaarylbiimidazole and p-dialkylaminobenzylidene ketone (see, JP-B-47-2528 and JP-A-54-155292 (the term "JP-A" as used herein means an "unexamined published Japanese patent application")), a system comprising a cyclic cis-α-dicarbonyl compound and a dye (see, JP-A-54-84183), a system comprising a substituted triazine and a merocyanine dye (see, JP-A-54-151024), a system comprising 3-ketocoumarin and an activator (see, JP-A-52-112681, JP-A-58-15503), a system comprising a biimidazole, a styrene derivative and a thiol (see, JP-A-59-140203), a system comprising an organic peroxide and a dye (see, JP-A-59-140203 and JP-A-59-189340) and a system comprising a dye having a rhodanine skeleton and a radical generating agent (see, JP-A-2-244050).

That the titanocene is effective as a photopolymerization initiator is described in JP-A-59-152396, JP-A-61-151197, JP-A-63-10602, JP-A-63-41484 and JP-A-3-12403 and examples of the combination use system thereof include a system comprising titanocene and a 3-ketocoumarin dye (see, JP-A-63-221110), a system where titanocene and a xanthene dye and further, an addition-polymerizable ethylenically unsaturated compound containing an amino group or a urethane group are used in combination (see, JP-A-4-221958 and JP-A-4-219756) and a system comprising titanocene and a specific merocyanine dye (see, JP-A-6-295061).

However, although these conventional techniques are surely effective to visible light rays, they are bound to problems such that the sensitivity is insufficient or even if high sensitivity is achieved, the storage stability is poor and hence, these combination systems cannot be used in practice.

SUMMARY OF THE INVENTION

An object of the present invention is to provide a highly sensitive photopolymerizable composition, more particularly, to provide a photopolymerizable composition highly sensitive to visible light rays of 400 nm or more and to light of 488 nm or 532 nm corresponding to the output of an Ar$^+$ layer or YAG-SHG laser light source.

Another object of the present is to provide a photopolymerizable composition excellent in the storage stability.

As a result of intensive investigations to achieve the above-described objects, the present inventors have found that a combination use system comprising a sensitizing dye having a specific structure and a titanocene compound capable of generating an active radical upon light irradiation in the presence of the sensitizing dye exhibits very high sensitivity to the visible light rays of 400 nm or more and is excellent in the storage stability and based on this finding, the present invention has been accomplished. According to the present invention, a photopolymerizable composition high sensitive to light rays in the visible region and having high storage stability can be obtained.

More specifically, the present invention provides a photopolymerizable composition comprising: (a) an addition-polymerizable compound having at least one ethylenic unsaturated double bond; (b) a sensitizing dye represented by the following formula (I); and (c) a titanocene compound:

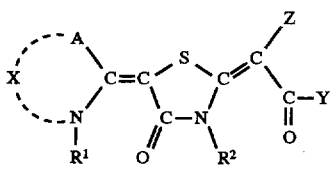

(I)

wherein $R^1$ and $R^2$, which may be the same or different, each represents a hydrogen atom, an alkyl group, a substituted alkyl group, an alkenyl group, a substituted alkenyl group, an alkoxycarbonyl group, an aryl group, a substituted aryl group, an alkynyl group or a substituted alkynyl group;

A represents an oxygen atom, a sulfur atom, a carbon atom substituted by an alkyl group or an aryl group or a carbon atom substituted by two alkyl groups;

X represents a nonmetallic atom group necessary for forming a nitrogen-containing heterocyclic 5-membered ring;

Y represents a phenyl group, a substituted phenyl group or an unsubstituted or substituted heteroaromatic ring;

Z represents a hydrogen atom, an alkyl group, a substituted alkyl group, an aryl group, a substituted aryl group, an alkoxy group, an alkylthio group, an arylthio group, a substituted amino group, an acyl group or an alkoxycarbonyl group; and Z and Y may be combined with each other to form a ring.

DETAILED DESCRIPTION OF THE INVENTION

In one embodiment of the present invention, the photopolymerizable initiation system comprising the components (a) and (b) further contains at least one compound selected from the group consisting of the compounds 1) to 8):

1) a compound having a carbon-halogen bond;

2) a ketone compound represented by the following formula (II):

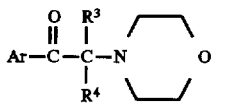

(II)

wherein Ar represents an aromatic group selected from those represented by the following formulae:

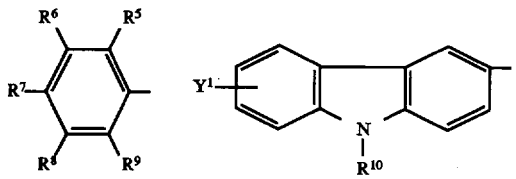

wherein $R^5$, $R^6$, $R^7$, $R^8$ and $R^9$, which may be the same or different, each represents a hydrogen atom, a halogen atom, an alkyl group, an alkenyl group, an aryl group, a substituted aryl group, a hydroxyl group, an alkoxy group, an —S—$R^{11}$ group, an —SO—$R^{11}$ group or an —SO$_2$—$R^{11}$ group, provided that at least one of $R^5$, $R^6$, $R^7$, $R^8$ and $R^9$ represents an —S—$R^{11}$ or —SO—$R^{11}$ group (wherein $R^{11}$ represents an alkyl group or an alkenyl group), $R^{10}$ represents a hydrogen atom, an alkyl group or an acyl group and $Y^1$ represents a hydrogen atom or

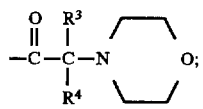

$R^3$ and $R^4$ each represents a hydrogen atom or an alkyl group and $R^3$ and $R^4$ may be combined with each other to represent an alkylene group;

3) a ketooxime compound represented by the following formula (III):

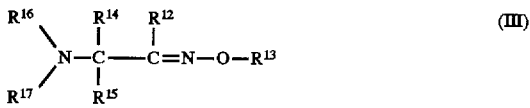

(III)

wherein $R^{12}$ and $R^{13}$, which may be the same or different, each represents a hydrocarbon group which may have a substituent or may contain an unsaturated bond or a heterocyclic ring;

$R^{14}$ and $R^{15}$, which may be the same or different, each represents a hydrogen atom, a hydrocarbon group which may have a substituent or may contain an unsaturated bond, a heterocyclic group, a hydroxyl group, a substituted oxy group, a mercapto group or a substituted thio group, and $R^{14}$ and $R^{15}$ may be combined with each other to form a ring and represent an alkylene group having from 2 to 8 carbon atoms which may contain —O—, —$NR^{16}$—, —O—CO—, —NH—CO—, —S—and/or —SO$_2$— in the linking main chain of the ring; and $R^{16}$ and $R^{17}$ each represents a hydrogen atom, a hydrocarbon group which may have a substituent or may contain an unsaturated bond or a substituted carbonyl group;

4) an organic peroxide;

5) a thio compound represented by formula (IV):

(IV)

wherein $R^{18}$ represents an alkyl group, an aryl group or a substituted aryl group and $R^{19}$ represents a hydrogen atom or an alkyl group, or $R^{18}$ and $R^{19}$ may be combined with each other to represent a nonmetallic atom group necessary for forming a 5-, 6- or 7-membered ring which may contain a hetero atom selected from an oxygen atom, a sulfur atom and a nitrogen atom;

6) hexaarylbiimidazole;

7) an aromatic onium salt; and 8) a ketooxime ester.

DETAILED DESCRIPTION OF THE INVENTION

The present invention is described below in detail.

The polymerizable compound having an addition-polymerizable unsaturated bond of the present invention is selected from the compounds having at least one, preferably two or more terminal ethylenically unsaturated bonds. In other words, the compound has a chemical form such as a monomer, a prepolymer, namely, a dimer, a trimer or an oligomer, a mixture of these or a copolymer thereof. Examples of the monomer and the copolymer thereof include an ester of an unsaturated carboxylic acid (e.g., acrylic acid, methacrylic acid, itaconic acid, crotonic acid, isocrotonic acid, maleic acid) with an aliphatic polyhydric alcohol compound and an amide of an unsaturated carboxylic acid with an aliphatic polyhydric amine compound.

Specific examples of the monomer for the ester of an aliphatic polyhydric alcohol compound with an unsaturated carboxylic acid include:

as an acrylic ester, ethylene glycol diacrylate, triethylene glycol diacrylate, 1,3-butandiol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer;

as a methacrylic ester, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane;

as an itaconic ester, ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

as a crotonic ester, ethylene glycol dicrotonate, tetramethylene glycol dicrotonate, pentaerythritol dicrotonate and sorbitol tetradicrotonate;

as an isocrotonic ester, ethylene glycol diisocrotonate, pentaerythritol diisocrotonate and sorbitol tetraisocrotonate;

as a maleic ester, ethylene glycol dimaleate, triethylene glycol dimaleate, pentaerythritol dimaleate and sorbitol tetramaleate; and a mixture of these ester monomers.

Specific examples of the monomer for the amide of an aliphatic polyhydric amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriamine-trisacrylamide, xylylenebisacrylamide, xylylenebis-methacrylamide.

Examples of other compounds include a vinylurethane compound having two or more polymerizable vinyl groups in one molecule resulting from adding a vinyl monomer having a hydroxyl group represented by the following formula (A) to a polyisocyanate compound having two or more isocyanate groups in one molecule described in JP-B-48-41708:

$$CH_2=C(R)COOCH_2CH(R')OH \quad (A)$$

(wherein R and R' each represents H or $CH_3$).

Further, polyfunctional acrylates and methacrylates such as urethane acrylates as described in JP-A-51-37193, polyester acrylates as described in JP-A-48-64183, JP-B-49-43191 and JP-B-52-30490 and epoxy acrylates resulting from reacting an epoxy resin with a (meth)acrylic acid may be used. Also, those described in *Nippon Secchaku Kyokaishi*, vol. 20, No. 7, pp. 300–308 (1984) as photo-curable monomers and oligomers may be used. The use amount of the component (a) is from 5 to 50 wt % (hereinafter simply referred to as "%"), preferably from 10 to 40%, based on the entire components in the composition (solids content).

A photopolymerization initiation system which is a second essential factor for the photopolymerizable composition of the present invention is described below. The photopolymerization initiation system of the present invention comprises a combination of at least two kinds of components and the first component is a sensitizing dye represented by formula (I).

In formula (I), $R^1$ and $R^2$, which may be the same or different, each represents a hydrogen atom, an alkyl group, a substituted alkyl group, an alkenyl group, a substituted alkenyl group, an alkoxycarbonyl group, an aryl group, a substituted aryl group, an alkynyl group or a substituted alkynyl group.

The alkyl group includes linear, branched and cyclic alkyl groups each having from 1 to 20 carbon atoms and specific examples thereof include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cylopentyl group and a 2-norbornyl group. Among these, preferred are a linear alkyl group having from 1 to 12 carbon atoms, a branched alkyl group having from 3 to 12 carbon atoms and a cyclic alkyl group having from 5 to 10 carbon atoms.

The substituent for the substituted alkyl group is a monovalent nonmetallic atom group exclusive of hydrogen and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, N'-alkyl-N-alkylureido group, an N'-alkyl-N-alkylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N- aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, N,N-diarylcarbamoyl group, an N-alkyl-N-arylcarbamoyl group, an alkylsulfinyl group, an arylsulfinyl group, a sulfo group (—$SO_3H$) and a conjugated base group thereof (hereinafter called a sulfonate group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugated base group thereof (hereinafter called a phosphonate group), a dialkylphosphono group (—$PO_3(alkyl)_2$), a diarylphosphono group (—$PO_3(aryl)_2$), an alkylarylphosphono group (—$PO_3(alkyl)(aryl)$), a monoalkylphosphono group (—$PO_3(alkyl)$) and a conjugated base group thereof (hereinafter called an alkyl phosphonate group), a monoarylphosphono group (—$PO_3H(aryl)$) and a conjugated base group thereof (hereinafter called an aryl phosphonate group), a phosphonooxy group (—$OPO_3H_2$) and a conjugated base group thereof (hereinafter called a phosphonate oxy group), a dialkylphosphonooxy group (—$OPO_3(alkyl)_2$), a diarylphosphonooxy group (—$OPO_3(aryl)_2$), an alkylarylphosphonooxy group (—$OPO_3(alkyl)(aryl)$), a monoalkylphosphonooxy group (—$OPO_3H(alkyl)$) and a conjugated base group thereof (hereinafter called an alkyl phosphonate oxy group), a monoarylphosphonooxy group (—$OPO_3H(aryl)$) and a conjugated base group thereof (hereinafter called an aryl phosphonate oxy group), a cyano group, a nitro group, an aryl group, an alkenyl group and an alkynyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonate phenyl group, a phosphonophenyl group and a phosphonate phenyl group.

Examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group and a trimethylsilylethynyl group. Examples of the group represented by R in the acyl group (RCO—) include hydrogen and the above-described alkyl and aryl groups. Among these substituents, more preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonate group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonate group, a dialkylphosphono group, a diarylphosphono group, a monoalkylphosphono group, an alkyl phosphonate group, a monoarylphosphono group, an aryl phosphonate group, a phosphonooxy group, a phosphonate oxy group, an aryl group and an alkenyl group.

Specific examples of the substituted alkyl group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonate butyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyl group, an octyl group, a phosphonobutyl group, a phosphonate hexyl group, a diethylphosphonobutyl group, a diphenylphosphonopropyl group, a methylphosphonobutyl group, a methyl phosphonate butyl group, a tolylphosphonohexyl group, a tolyl phosphonate hexyl group, a phosphonooxypropyl group, a phosphonate oxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group includes a condensed ring formed by from 1 to 3 benzene rings and a condensed ring formed by a benzene ring and a 5-membered unsaturated ring.

The substituent for the substituted aryl group includes the above-described substituents for the substituted alkyl group. Specific examples of the substituted aryl group include a phenyl group, a naphthyl group, an anthryl group, a phenanthryl group, an indenyl group, an acetonaphthenyl group and a fluorenyl group.

The alkenyl group includes linear, branched and cyclic alkenyl groups each having from 1 to 20 carbon atoms.

The substituent for the substituted alkenyl group includes the substituents described above for the substituted alkyl group and specific examples of the unsubstituted or substituted alkenyl group include a vinyl group, a 1-propenyl group, a 1-butenyl group, 1-methyl-1-propenyl group, a styryl group, a 2-pentenyl group and a 2-cyclohexynyl group.

The alkynyl group includes linear and branched alkynyl groups each having from 1 to 20 carbon atoms.

The substituent for the substituted alkynyl group includes the above-described substituents for the substituted alkynyl group and specific examples of the unsubstituted or substituted alkynyl group include ethynyl, 2-phenylethynyl and 1-butynyl.

The alkoxycarbonyl group includes a residue containing a linear, branched or cyclic alkyl group having from 1 to 10 carbon atoms bonded to an oxycarbonyl group and specific examples thereof include a methoxycarbonyl group, an ethoxycarbonyl group, a propoxycarbonyl group, a butoxycarbonyl group, a sec-butoxycarbonyl group and a tert-butoxycarbonyl group.

In the present invention, $R^1$ and $R^2$, which are described in the foregoing, each is preferably an alkyl group, a substituted alkyl group, an alkenyl group, a substituted alkenyl group, an alkynyl group or a substituted alkynyl group.

A in formula (I) represents an oxygen atom, a sulfur atom, a carbon atom substituted by an alkyl group or an aryl group or a carbon atom substituted by two alkyl groups.

The aryl group and the alkyl group for A include those described above for the aryl group and the alkyl group of $R^1$ and $R^2$.

Examples of the nitrogen-containing 5-membered ring accomplished by X in cooperation with A, C and N include those described below.

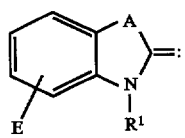
(a-1)

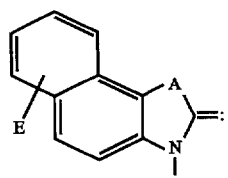
(a-2)

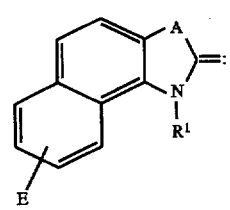
(a-3)

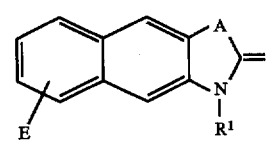
(a-4)

The substituent E in formulae (a-1) to (a-4) has a Hammett's σ value of from −0.9 to +0.5. Examples thereof include a hydrogen atom, a methyl group, an isopropyl group, a tert-butyl group, a phenyl group, a trifluoromethyl group, an acetyl group, an ethoxycarbonyl group, a carboxyl group, a carboxylate group (—COO⁻), an amino group, a methylamino group, a dimethylamino group, an ethylamino group, a diethylamino group, all acetylamino group, —PO₃H group, a methoxy group, an ethoxy group, a propoxy group, an isopropoxy group, a butoxy group, a benzyloxy group, a phenoxy group, a hydroxy group, an acetoxy group, a methylthio group, an ethylthio group, an isopropylthio group, a mercapto group, an acetylthio group, a thiocyano group (—SCN), a methylsulfinyl group, an ethylsulfinyl group, a methylsulfonyl group, an ethylsulfonyl group, an aminosulfonyl group, a dimethylsulfonyl group (—S⁺(CH₃)₂), a sulfonate group (—SO₂⁻), a fluorine atom, a chlorine atom, a bromine atom, an iodine atom, an iodyl group, a trimethylsilyl group (—Si(CH₃)₃), a triethylsilyl group and a trimethylstannyl group (—Sn(CH₃)₃). Preferred among these substituents are a hydrogen atom, a methyl group, an ethyl group, a methoxy group, an ethoxy group, a dimethylamino group, a diethylamino group, a chlorine atom and a bromine atom.

Examples of Y in formula (I) are described below.

The substituent for the substituted phenyl group includes those described above for E. The polynuclear aromatic ring includes a naphthyl group, an anthryl group and a phenanthryl group and these groups each may be substituted by the above-described substituent E. Examples of the heteroaromatic ring include a 2-furyl group, a 3-furyl group, a 2-thienyl group, a 3-thienyl group, a 2-pyrrolyl group and a 3-pyrrolyl group and these groups may be substituted by the above-described substituent E.

Examples of Z in formula (I) are described below. The alkyl group, the substituted alkyl group, the aryl group and the substituted aryl group each includes those described above as examples of respective groups for $R^1$ and $R^2$ in formula (I).

The alkylthio group and the arylthio group include residues resulting from bonding a linear, branched or cyclic alkyl group having from 1 to 10 carbon atoms or an aryl group having from 1 to 20 carbon atoms to a thio group (sulfur atom) and specific examples thereof include a methylthio group, an ethylthio group, a propylthio group, a butylthio group, a sec-butylthio group, a tert-butylthio group, a phenylthio group and a naphthylthio group.

The alkoxyl group includes a residue resulting from bonding a linear, branched or cyclic alkyl group having from 1 to 10 carbon atoms to an oxy group (oxygen atom) and specific examples thereof include a methoxyl group, an ethoxyl group, a propoxyl group, a butoxyl group, a sec-butoxyl group, a tert-butoxyl group.

The substituted amino group includes an amino group substituted by a linear, branched or cyclic alkyl group having from 1 to 10 carbon atoms and specific examples thereof include a dimethylamino group, a diethylamino group and a dipropylamino group.

The acyl group includes a residue resulting from bonding a linear, branched or cyclic alkyl, phenyl or naphthyl group having from 1 to 10, preferably from 1 to 6 carbon atoms to a carbonyl group and specific examples thereof include a formyl group, an acetyl group, a propionyl group, a butyryl group, a valeryl group, a benzoyl group and a naphthoyl group.

The alkoxycarbonyl group includes a residue resulting from bonding a linear, branched or cyclic alkyl group having from 1 to 10 carbon atoms to an oxycarbonyl group and specific examples thereof include a methoxycarbonyl group, an ethoxycarbonyl group, a propoxycarbonyl group, a butoxycarbonyl group, a sec-butoxycarbonyl group and a tert-butoxycarbonyl group.

Examples of the ring formed by combining Y and Z with each other are set forth below.

(b-1):
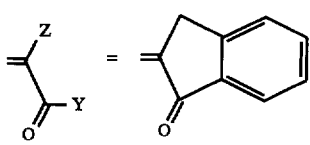
(b-2):
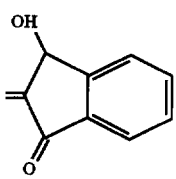
(b-3):
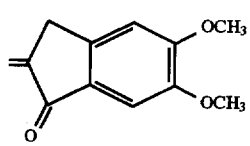
(b-4):
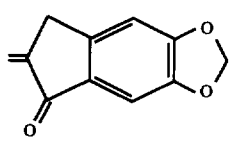
(b-5):
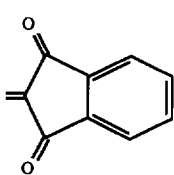
(b-6):
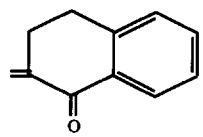
(b-7):
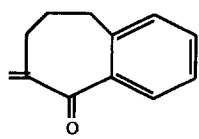
(b-8):
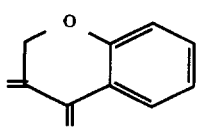
(b-9):
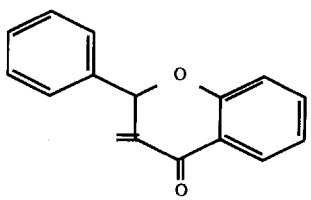
(b-10):
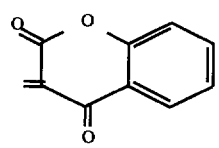
(b-11):
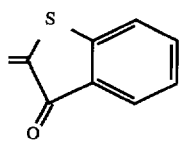
(b-12):
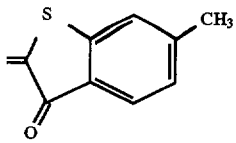
(b-13):
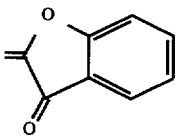
(b-14):
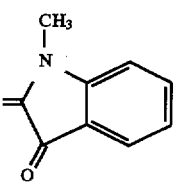
The compounds represented by formula (I) can be synthesized according to the methods described in *Rull. Soc. Chimie Belges* (Abstract), vol. 57, pp. 364–372 (1948) and *Chemical Abstracts*, vol. 44, columns 60e to 61d (1950).
Specific examples of the compound represented by formula (I) are set forth below.

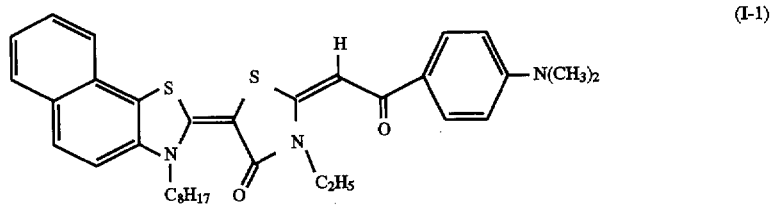
(I-1)
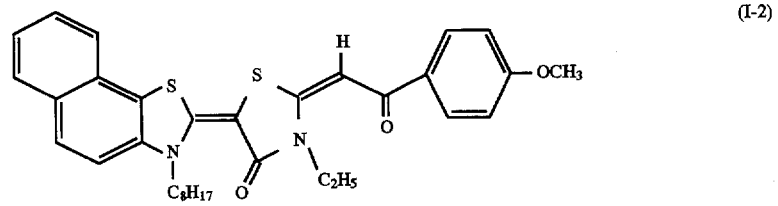
(I-2)
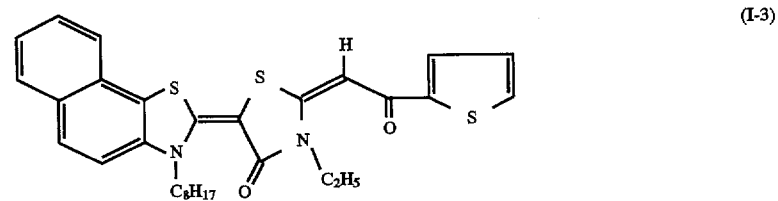
(I-3)
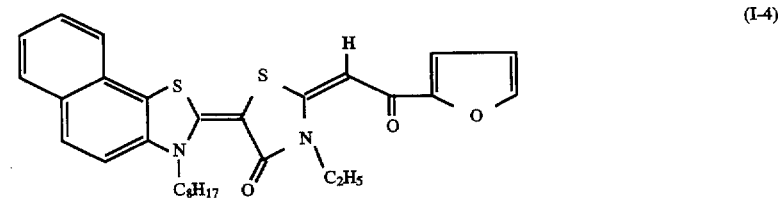
(I-4)
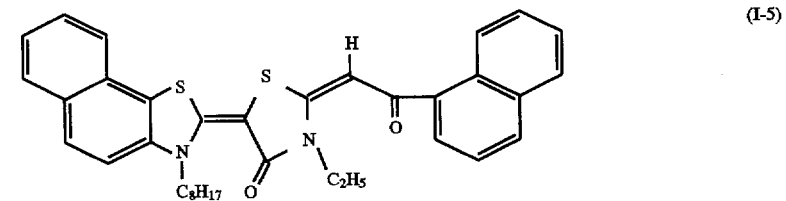
(I-5)
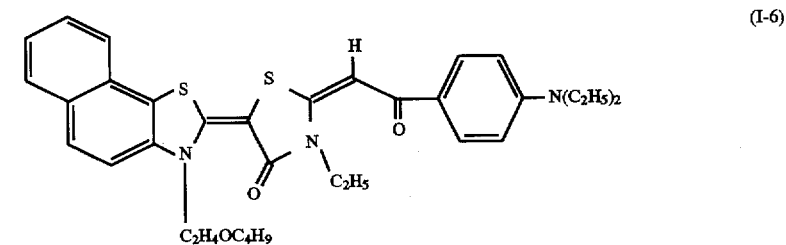
(I-6)
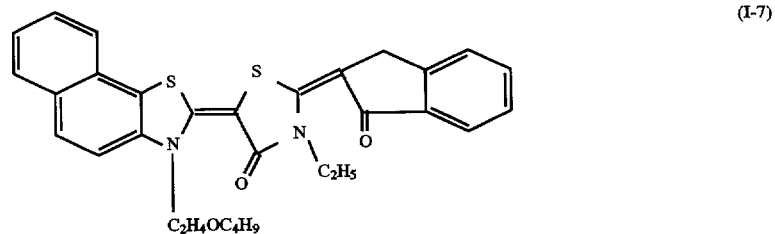
(I-7)

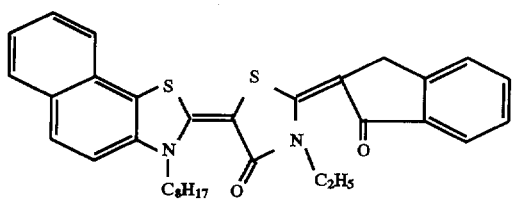
(I-8)
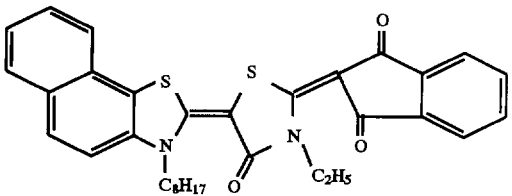
(I-9)
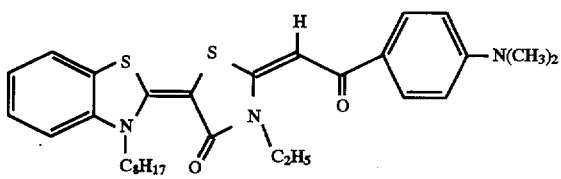
(I-10)
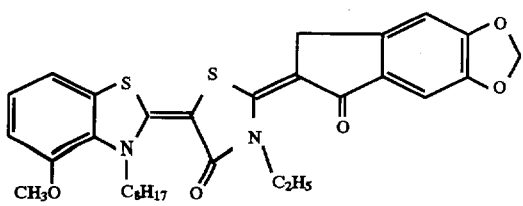
(I-11)
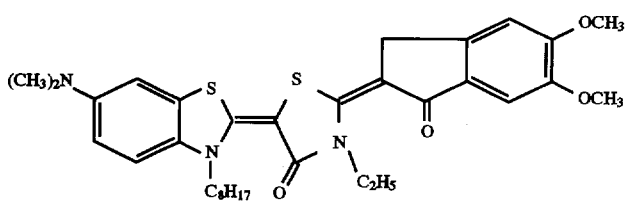
(I-12)
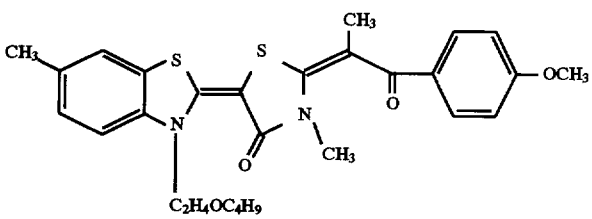
(I-13)
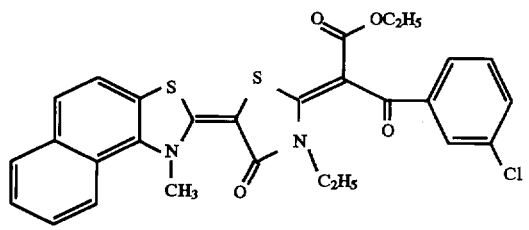
(I-14)

-continued
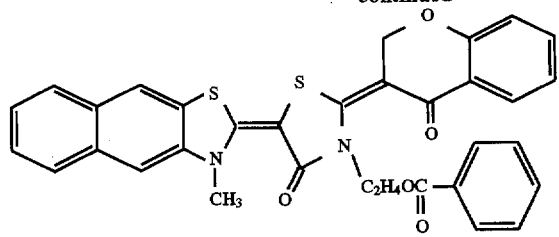
(I-15)
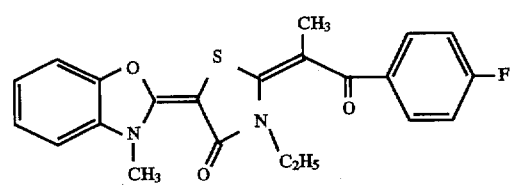
(I-16)
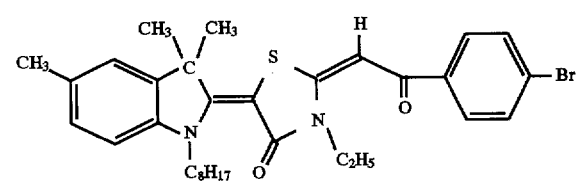
(I-17)
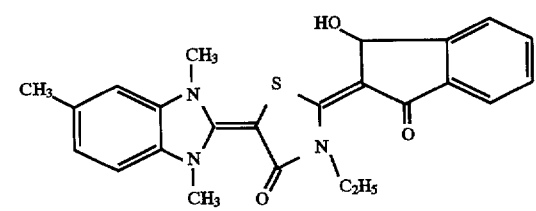
(I-18)
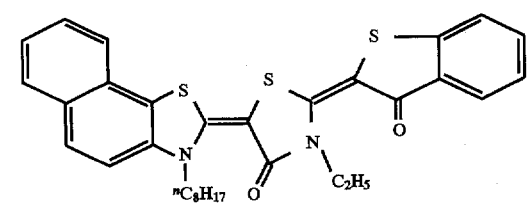
(I-19)
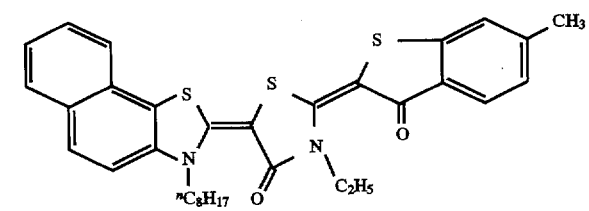
(I-20)
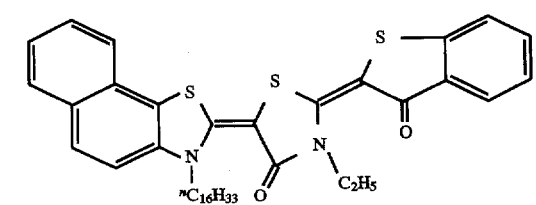
(I-21)
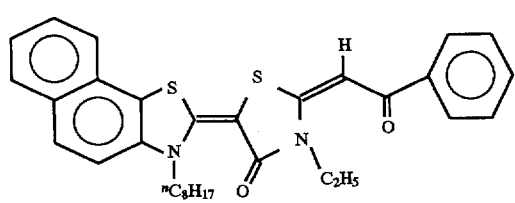
(I-22)

-continued
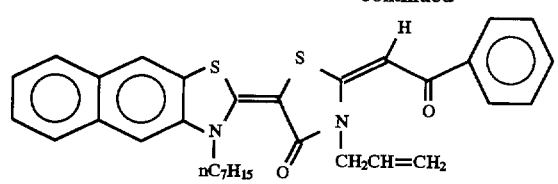 (I-23)
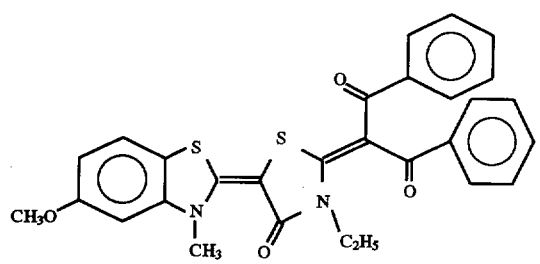 (I-24)
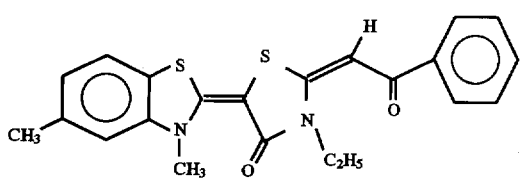 (I-25)
Table1, Table 2 (I-26~I-71)
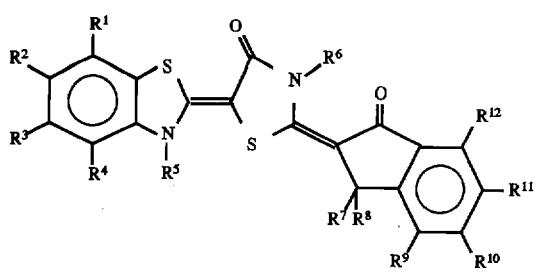
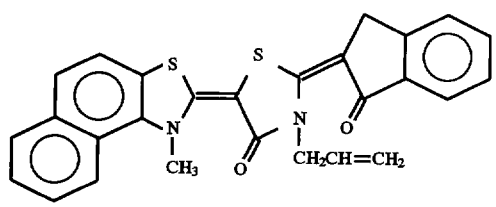 (I-72)
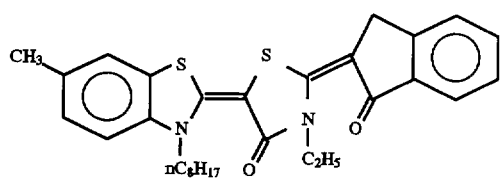 (I-73)
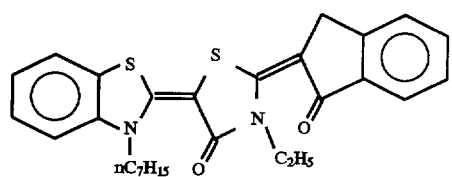 (I-74)

TABLE 1

| | R$^1$ | R$^2$ | R$^3$ | R$^4$ | R$^5$ | R$^6$ | R$^7$ | R$^8$ | R$^9$ | R$^{10}$ | R$^{11}$ | R$^{12}$ |
|---|---|---|---|---|---|---|---|---|---|---|---|---|
| I-26 | —H | —H | —H | —H | —C$_4$H$_9$ | —CH$_2$CH=CH$_2$ | —H | —H | —H | —H | —H | —H |
| I-27 | —H | —H | —H | —H | —C$_5$H$_{11}$ | —CH$_2$CH=CH$_2$ | —H | —H | —H | —H | —H | —H |
| I-28 | —H | —H | —H | —H | —C$_6$H$_{13}$ | —CH$_2$CH=CH$_2$ | —H | —H | —H | —H | —H | —H |
| I-29 | —H | —H | —H | —H | —C$_7$H$_{15}$ | —CH$_2$CH=CH$_2$ | —H | —H | —H | —H | —H | —H |
| I-30 | —H | —H | —H | —H | —C$_8$H$_{17}$ | —CH$_2$CH=CH$_2$ | —H | —H | —H | —H | —H | —H |
| I-31 | —H | —H | —H | —H | —C$_{10}$H$_{21}$ | —CH=CH$_2$ | —H | —H | —H | —H | —H | —H |
| I-32 | —H | —H | —H | —H | —C$_6$H$_{13}$ | —CH$_2$C≡CH | —H | —H | —H | —H | —H | —H |
| I-33 | —H | —Me | —H | —H | —C$_6$H$_{13}$ | —C≡CH | —H | —H | —H | —H | —H | —H |
| I-34 | —H | —Me | —H | —H | —C$_7$H$_{15}$ | —CH$_2$CH=CH$_2$ | —H | —H | —H | —H | —H | —H |
| I-35 | —H | —Me | —H | —H | —C$_8$H$_{17}$ | —CH$_2$CH=CH$_2$ | —H | —H | —H | —H | —H | —H |
| I-36 | —H | —Me | —H | —H | —C$_{10}$H$_{21}$ | —CH$_2$CH=CH$_2$ | —H | —H | —H | —H | —H | —H |
| I-37 | —H | —H | —Me | —H | —C$_6$H$_{13}$ | —CH$_2$CH=CH$_2$ | —H | —H | —H | —H | —H | —H |
| I-38 | —H | —Cl | —H | —H | —C$_7$H$_{15}$ | —CH$_2$CH=CH$_2$ | —H | —H | —H | —H | —H | —H |
| I-39 | —H | —H | —Cl | —H | —C$_8$H$_{17}$ | —CH$_2$CH=CH$_2$ | —H | —H | —H | —H | —H | —H |
| I-40 | —H | —OMe | —H | —H | —C$_6$H$_{13}$ | —CH$_2$CH=CH$_2$ | —H | —H | —H | —H | —H | —H |
| I-41 | —H | —H | —OMe | —H | —C$_8$H$_{17}$ | —CH$_2$CH=CH$_2$ | —H | —H | —H | —H | —H | —H |
| I-42 | —H | —OMe | —OMe | —H | —C$_8$H$_{17}$ | —CH$_2$CH=CH$_2$ | —H | —H | —H | —H | —H | —H |
| I-43 | —H | —N(CH$_3$)$_2$ | —H | —H | —C$_8$H$_{17}$ | —CH$_2$CH=CH$_2$ | —H | —H | —H | —H | —H | —H |
| I-44 | —H | —H | —H | —H | —C$_7$H$_{15}$ | —CH=CHC$_6$H$_5$ | —H | —H | —H | —H | —H | —H |
| I-45 | —H | —H | —H | —H | —C$_7$H$_{15}$ | —(CH$_2$)$_2$CH=CH$_2$ | —H | —H | —H | —H | —H | —H |
| I-46 | —H | —H | —H | —H | —C$_7$H$_{15}$ | —(CH$_2$)$_3$CH=CH$_2$ | —H | —H | —H | —H | —H | —H |
| I-47 | —H | —H | —H | —H | —C$_7$H$_{15}$ | —(CH$_2$)$_4$CH=CH$_2$ | —H | —H | —H | —H | —H | —H |
| I-48 | —H | —H | —H | —H | —C$_7$H$_{15}$ | —(CH$_2$)$_3$CH=CH$_2$ | —H | —H | —H | —H | —H | —H |
| I-49 | —H | —H | —H | —H | —C$_7$H$_{15}$ | —CH$_2$CH=CH$_2$ | —Me | —H | —H | —H | —H | —H |
| I-50 | —H | —H | —H | —H | —C$_7$H$_{15}$ | —CH$_2$CH=CH$_2$ | —Me | —Me | —H | —H | —H | —H |
| I-51 | —H | —H | —H | —H | —C$_7$H$_{15}$ | —CH$_2$CH=CH$_2$ | —Ph | —H | —H | —H | —H | —H |
| I-52 | —H | —H | —H | —H | —C$_7$H$_{15}$ | —CH$_2$CH=CH$_2$ | —H | —H | —H | —OMe | —H | —H |

TABLE 2

| | R$^1$ to R$^4$ | R$^5$ | R$^6$ | R$^7$ | R$^8$ | R$^9$ | R$^{10}$ | R$^{11}$ | R$^{12}$ |
|---|---|---|---|---|---|---|---|---|---|
| I-53 | —H | —C$_7$H$_{15}$ | —CH$_2$CH=CH$_2$ | —H | —H | —H | —H | —OMe | —H |
| I-54 | —H | —C$_7$H$_{15}$ | —CH$_2$CH=CH$_2$ | —H | —H | —H | —OMe | —OMe | —H |
| I-55 | —H | —C$_7$H$_{15}$ | —CH$_2$CH=CH$_2$ | —H | —H | —Br | —H | —H | —Me |
| I-56 | —H | —C$_7$H$_{15}$ | —CH$_2$CH=CH$_2$ | —H | —H | —Me | —H | —H | —Br |
| I-57 | —H | —CH$_2$CH$_2$OCH$_2$CH=CH$_2$ | —CH$_2$CH=CH$_2$ | —H | —H | —OMe | —OMe | —OMe | —H |
| I-58 | —H | —CH$_2$CH$_2$OCH$_2$CH$_2$OCH$_3$ | —CH$_2$CH=CH$_2$ | —H | —H | —H | —OMe | —OMe | —OMe |
| I-59 | —H | —(CH$_2$)$_4$SO$_3$ | —CH$_2$CH=CH$_2$ | —H | —H | —H | —H | —H | —H |
| I-60 | —H | —CH$_2$COOH | —CH$_2$CH=CH$_2$ | —H | —H | —H | —H | —H | —H |
| I-61 | —H | —CH$_2$CH$_2$COOH | —CH$_2$CH=CH$_2$ | —H | —H | —H | —H | —H | —H |
| I-62 | —H | —(CH$_2$)$_3$COOH | —CH$_2$CH=CH$_2$ | —H | —H | —H | —H | —H | —H |
| I-63 | —H | —CH$_2$COOC$_6$H$_{13}$ | —CH$_2$CH=CH$_2$ | —H | —H | —H | —H | —H | —H |
| I-64 | —H | —CH$_2$CH$_2$COOC$_2$H$_5$ | —CH$_2$CH=CH$_2$ | —H | —H | —H | —H | —H | —H |
| I-65 | —H | —C$_8$H$_{17}$ | —CH$_2$CH=CH$_2$ | —H | —H | —H | —N(CH$_3$)$_2$ | —H | —H |
| I-66 | —H | —C$_7$H$_{15}$ | —CH$_2$CH=CH$_2$ | —H | —H | —H | —NO | —H | —H |
| I-67 | —H | —C$_7$H$_{15}$ | —CH$_2$CH=CH$_2$ | —H | —H | —H | —F | —H | —H |
| I-68 | —H | —C$_6$H$_{13}$ | —CH$_2$CH=CH$_2$ | —H | —H | —H | —H | —H | —H |
| I-69 | —H | —C$_7$H$_{15}$ | —CH$_2$CH=CH$_2$ | —H | —H | —H | —H | —H | —H |
| I-70 | —H | —C$_8$H$_{17}$ | —CH$_2$CH=CH$_2$ | —H | —H | —H | —H | —H | —H |
| I-71 | —H | —C$_{10}$H$_{21}$ | —CH$_2$CH=CH$_2$ | —H | —H | —H | —H | —H | —H |

The sensitizing dyes represented by formula (I) for use in the photopolymerizable composition of the present invention can be suitably used individually or in combination of two or more thereof.

Next, the titanocene compound which is essential and important for the photopolymerization initiation system of the present invention is described below. The titanocene compound for use in the present invention may be appropriately selected from known compounds described, for example, in JP-A-59-152396 and JP-A-61-151197 as long as the compound is a titanocene compound capable of generating active radicals upon light irradiation when the above-described sensitizing dye is present together in the system.

More specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl (hereinafter referred to as A-1), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl (hereinafter referred to as A-2), dimethylcyclopentadienyl-Ti-bis-2,3,5,6-tetrafluorophen-1-yl, dimethylcyclopentadienyl-Ti-bis-2,4-difluorophen-1-yl and bis(cyclopentadienyl)-bis(2,6-difluoro-3-(pyr-1-yl)-phenyl)titanium (hereinafter referred to as A-3).

The titanocene compounds for used in the photopolymerizable composition of the present invention may be used individually or in combination of two or more.

With respect to the use amount of the above-described sensitizing dye and titanocene compound constituting the photopolymerization initiation system for use in the photopolymerizable composition of the present invention, it is suitable to use the sensitizing dye in an amount of from 0.05 to 30, preferably from 0.1 to 20, more preferably from 0.2 to 10 parts by weight, and the titanocene compound in an amount of from 0.5 to 100, preferably from 1 to 80, more preferably from 2 to 50 parts by weight, each per 100 parts by weight of the ethylenically unsaturated compound.

The photopolymerizable composition of the present invention may contain, in addition to the above-described sensitizing dye and the titanocene compound, compounds 1) to 8) which will be described below, for the purpose of increasing the sensitivity.

Compound 1) having a carbon-halogen bond is preferably a compound represented by the following formula (V), (VI), (VII), (VIII), (IX), (X) or (XI):

A compound represented by formula (V):

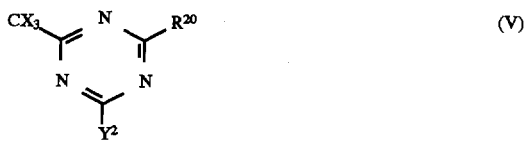

(V)

wherein X represents a halogen atom, $Y^2$ represents $-CX_3$, $-NH_2$, $-NHR^{21}$, $-NR^{21}$ or $-OR^{21}$ (wherein $R^{21}$ represents an alkyl group, a substituted alkyl group, an aryl group or a substituted aryl group) and $R^{20}$ represents $-CX_3$, an alkyl group, a substituted alkyl group, an aryl group, a substituted aryl group or a substituted alkenyl group;

A compound represented by formula (VI):

(VI)

wherein $R^{22}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group, X represents a halogen atom and n represents an integer of from 1 to 3;

A compound represented by formula (VII):

$$R^{23}-Z^2-CH_{2-m}X_m-R^{24}$$ (VII)

wherein $R^{23}$ represents an aryl group or a substituted aryl group, $R^{24}$ represents $-CO-NR^{25}R^{26}$ (wherein $R^{25}$ and $R^{26}$ each represents an alkyl group, a substituted alkyl group, an alkenyl group, a substituted alkenyl group, an aryl group or a substituted aryl group),

(wherein $R^{27}$ has the same meaning as $R^{21}$ in formula (V)) or a halogen, $Z^2$ represents $-CO-$, $-CS-$ or $-SO_2-$ and m represents 1 or 2;

A compound represented by formula (VIII):

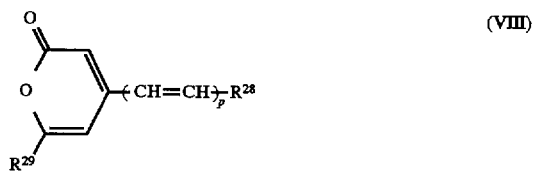

(VIII)

wherein $R^{28}$ represents an aryl or heterocyclic group which may be substituted, $R^{29}$ represents a trihaloalkyl or trihaloalkenyl group having from 1 to 3 carbon atoms and p represents 1, 2 or 3;

A carbonylmethylene heterocyclic compound having a trihalogenomethyl group represented by formula (IX):

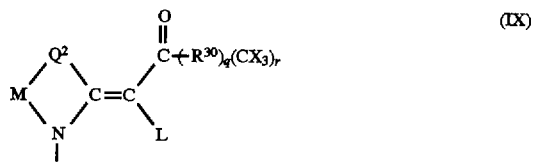

(IX)

wherein L represents a hydrogen atom or a substituent represented by the formula: $CO-(R^{30})_n(CX_3)_m$, M represents a substituted or unsubstituted alkylene group, $Q^2$ represents a sulfur atom, a selenium atom, an oxygen atom, a dialkylmethylene group, an alken-1,2-ylene group, a 1,2-phenylene group or an $N-R^{31}$ group, M and Q may be combined to form a 3- or 4-membered heterocyclic ring, $R^{31}$ represents an alkyl group, an aralkyl group or an alkoxyalkyl group, $R^{30}$ represents a carbocyclic or heterocyclic aromatic group, X represents a chlorine, bromine or iodine atom, m is 0 or an integer of from 1 to 3, n is 0, 1 or 2, and q is 0 when r is 1 or q is 1 when r is 1 or 2;

A 4-halogeno-5-(halogenomethylphenyl)oxazole derivative represented by formula (X):

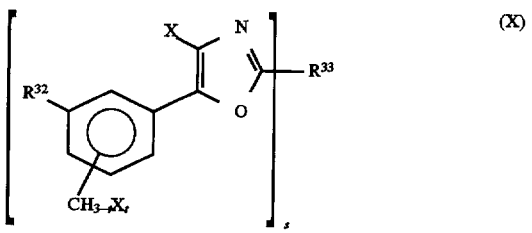

(X)

wherein X represents a halogen atom, t represents an integer of from 1 to 3, s represents an integer of from 1 to 4, $R^{32}$ represents a hydrogen atom or a $CH_{3-t}X_t$ group and $R^{33}$ represents an s-valent unsaturated organic group which may be substituted;

A 2-(halogenomethylphenyl)-4-halogenooxazole derivative represented by formula (XI):

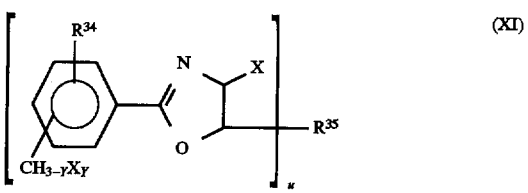

(XI)

wherein X represents a halogen atom, v represents an integer of from 1 to 3, u represents an integer of from 1 to 4, $R^{34}$ represents a hydrogen atom or a $CH_{3-v}X_v$ group and $R^{35}$ represents a u-valent unsaturated organic group which may be substituted.

Examples of the above-described compounds having a carbon-halogen bond include the compounds described in Wakabayashi et al, *Bull. Chem. Soc. Japan*, 42, 2924 (1969) such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-($\alpha,\alpha,\beta$-trichloroethyl)-4,6-bis(trichloromethyl)-S-triazine; the compounds described in British Patent 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine; the compounds described in JP-A-53-133428 such as 2-(4-methoxynaphtho-1-yl)-4,6-bistrichloromethyl-S-triazine, 2-(4-ethoxynaphtho-1-yl)-4,6-bistrichloromethyl-S-triazine, 2-[4-(2-ethoxyethyl)-naphtho-1-yl]-4,6-bistrichloromethyl-S-triazine, 2-(4,7-dimethoxynaphtho-1-yl]-4,6-bistrichloromethyl-S-triazine and 2-(acenaphtho-5-yl)-4,6-bistrichloromethyl-S-triazine; and the compounds described in German Patent 3,337,024 of which specific examples are set forth below.

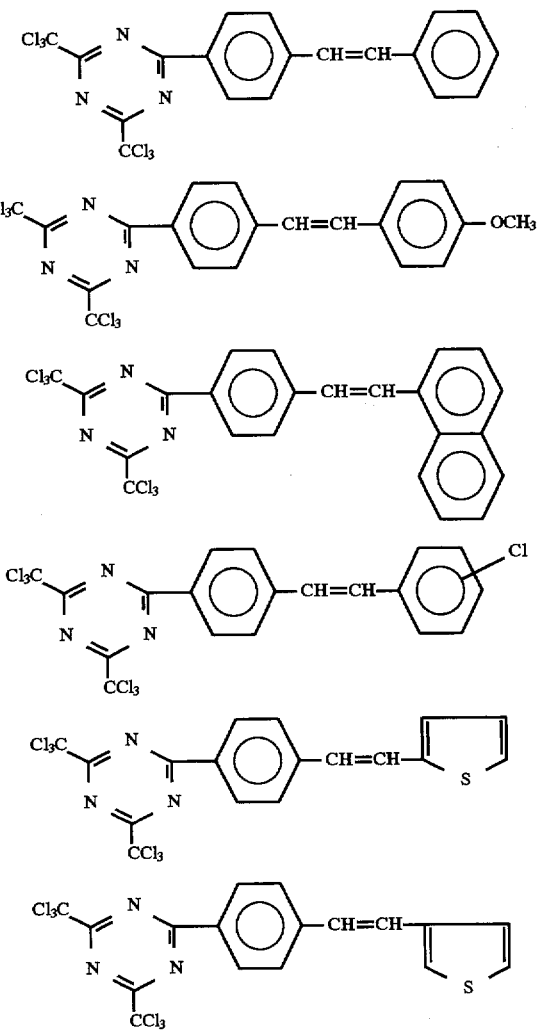

Further, included are the compounds described in F. C. Schaefer et al, *J. Org. Chem.*, 29, 1527 (1964) such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine and 2-methoxy-4-methyl-6-trichloromethyl-S-triazine, and the compounds described in JP-A-62-58241 of which specific examples are set forth below.

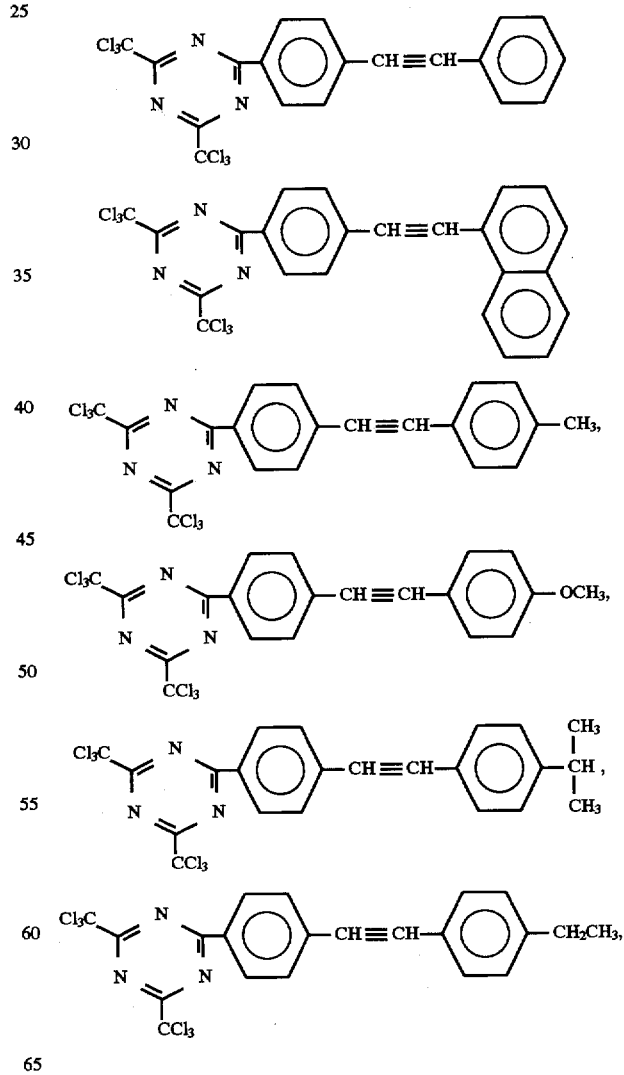

Also, included are the compounds described in JP-A-5-281728 of which specific examples are set forth below.

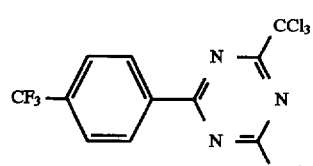
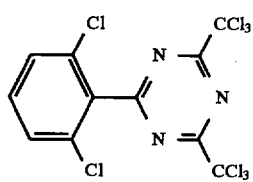
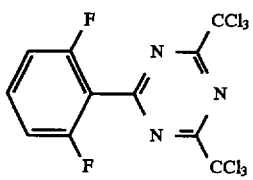
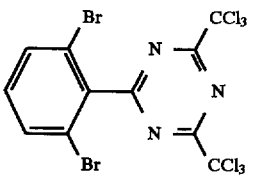
Still further, included are the compounds set forth below, which can be easily synthesized by a person skilled in the art according to the synthesis method described in M. P. Hutt, E. F. Elslager and L. M. Werbel, *Journal of Heterocyclic Chemistry*, Vol. 7 (No. 3), page 511 et seq (1970).
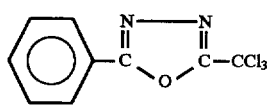
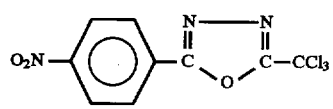
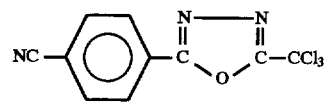
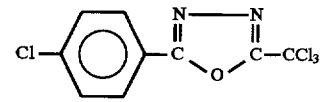
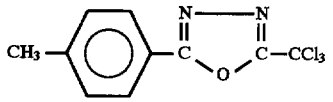
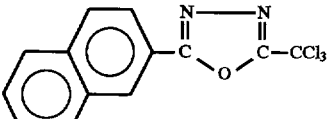
-continued
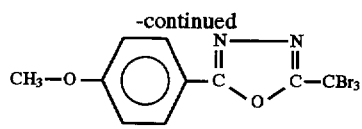
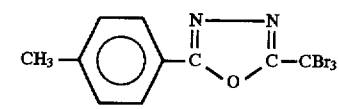
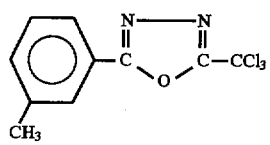
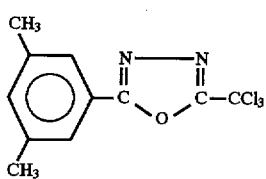
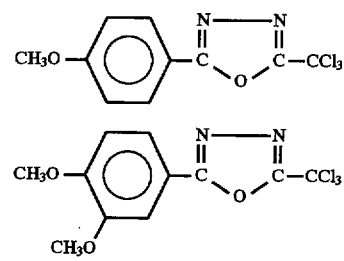
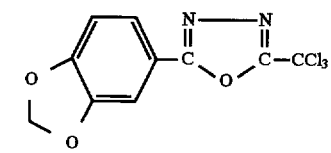
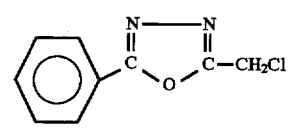
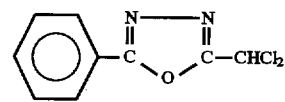
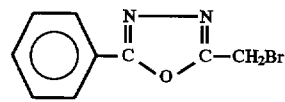
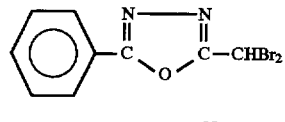
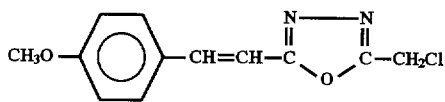
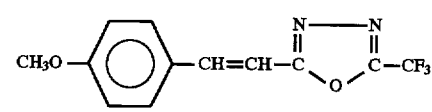

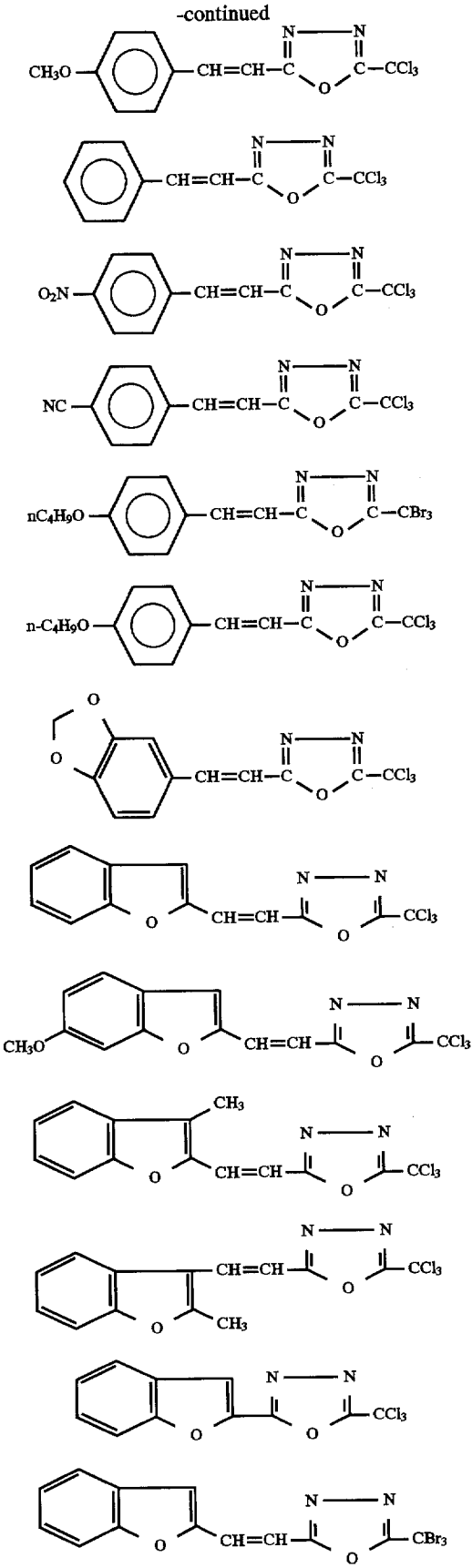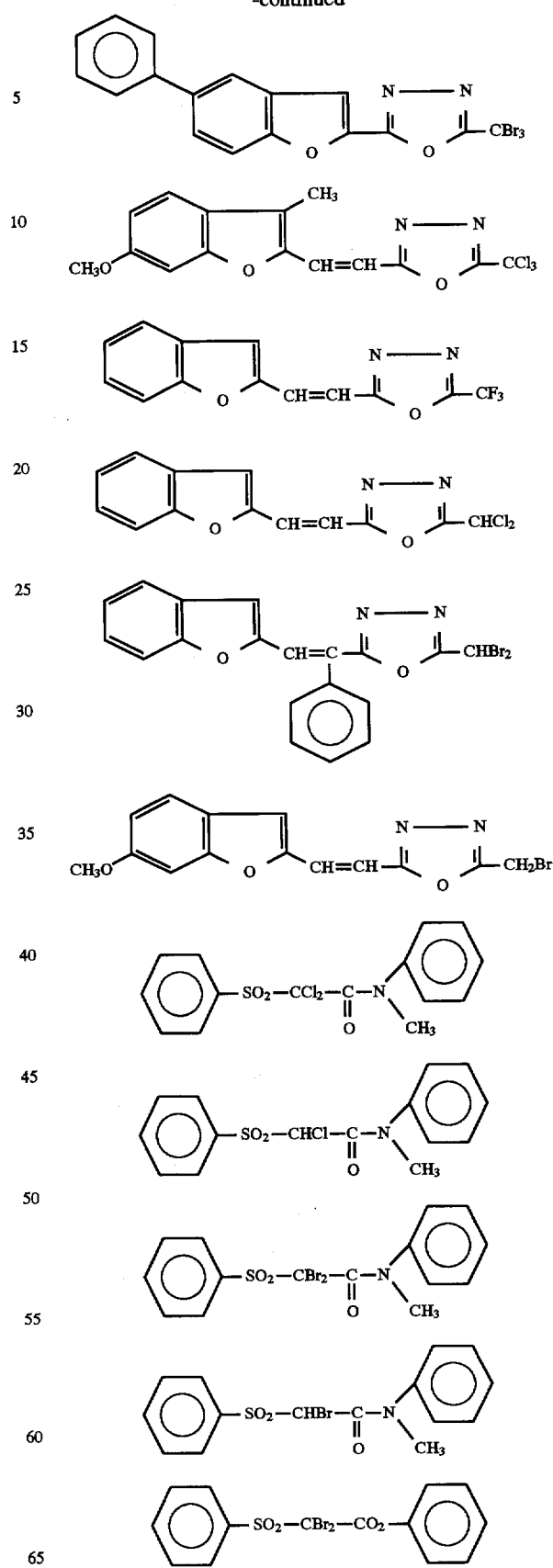

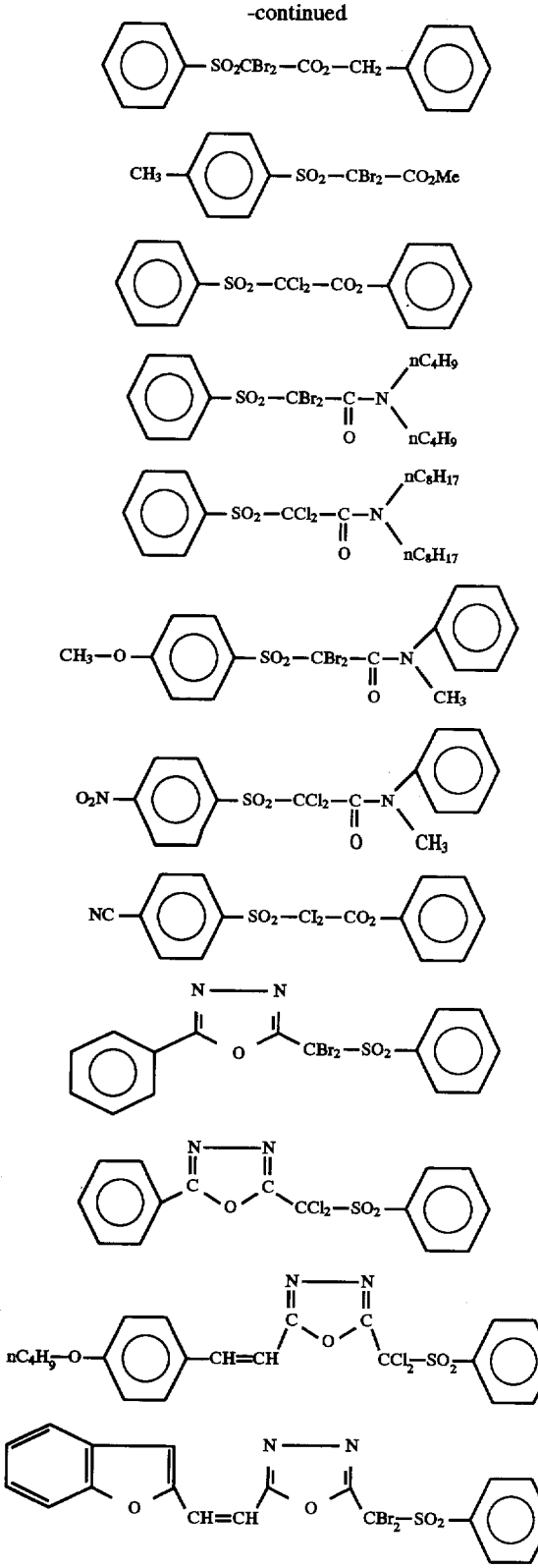

Also, included are the compounds described in German Patent 2,641,100 such as 4-(4-methoxystyryl)-6-(3,3,3-trichloropropenyl)-2-pyrone and 4-(3,4,5-trimethoxystyryl)-6-trichloromethyl-2-pyrone, and the compounds described in German Patent 3,333,450 of which specific examples are set forth below.

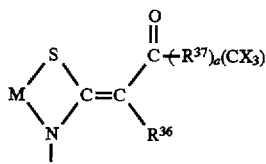

| | $R^{38}$ | M | $R^{36}$ | a | $CX_3$ |
|---|---|---|---|---|---|
| 1 | $C_2H_5$ | 1,2-phenylene | H | 1 | 4-$CCl_3$ |
| 2 | $CH_2C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CF_3$ |
| 5 | $C_2H_5$ | 5-$CH_3$-1,2-phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | 4-$CCl_3$ |

Further, included are the compounds described in German Patent 3,021,590 of which specific examples are set forth below.

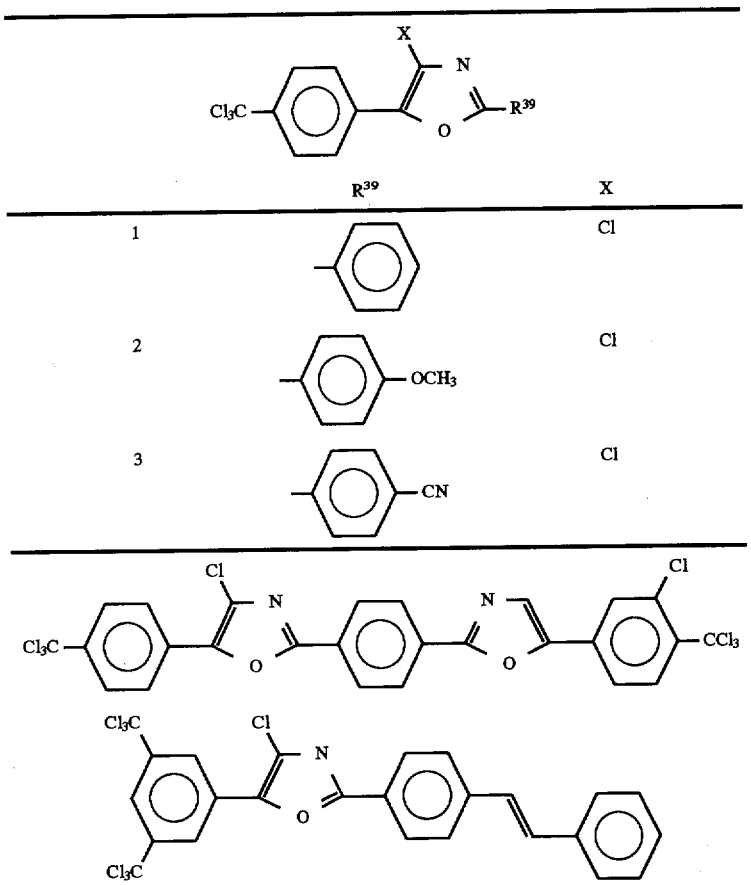

Further, included are the compounds described in German Patent 3,021,599 of which specific examples are set forth below.

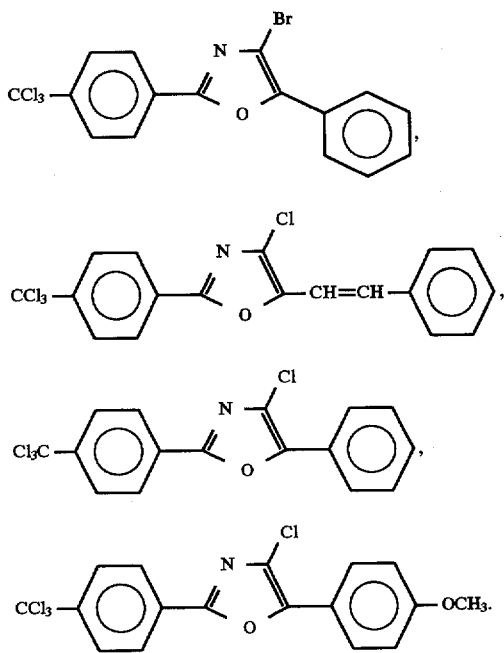

The ketone compound represented by formula (II) as component 2) for use in the present invention is described below. In formula (II) and the formulae for the aromatic group represented by Ar in formulae (II), $R^3$ and $R^4$ each represents a hydrogen atom or an alkyl group having from 1 to 8 carbon atoms or $R^3$ and $R^4$ may be combined to represent an alkylene group, $R^5$, $R^6$, $R^7$, $R^8$ and $R^9$ each independently represents a hydrogen atom, a halogen atom, an alkyl group having from 1 to 12 carbon atoms, an alkenyl group having from 3 to 12 carbon atoms, an aryl group, an alkoxy group having from 1 to 12 carbon atoms, a hydroxyl group, an —S—$R^{11}$ group, an —SO—$R^{11}$ group or an —$SO_2$—$R^{11}$ group, $R^{11}$ represents an alkyl group or an alkenyl group, and $R^{10}$ represents a hydrogen atom, an alkyl group having from 1 to 12 carbon atoms or an acyl group having from 2 to 13 carbon atoms. The alkyl group, the aryl group, the alkenyl group and the acyl group each may further be substituted by a substituent having from 1 to 6 carbon atoms.

Specific examples of the ketone compound include the following compounds which are described in U.S. Pat. No. 4,318,791 and European Patent 0284561A.

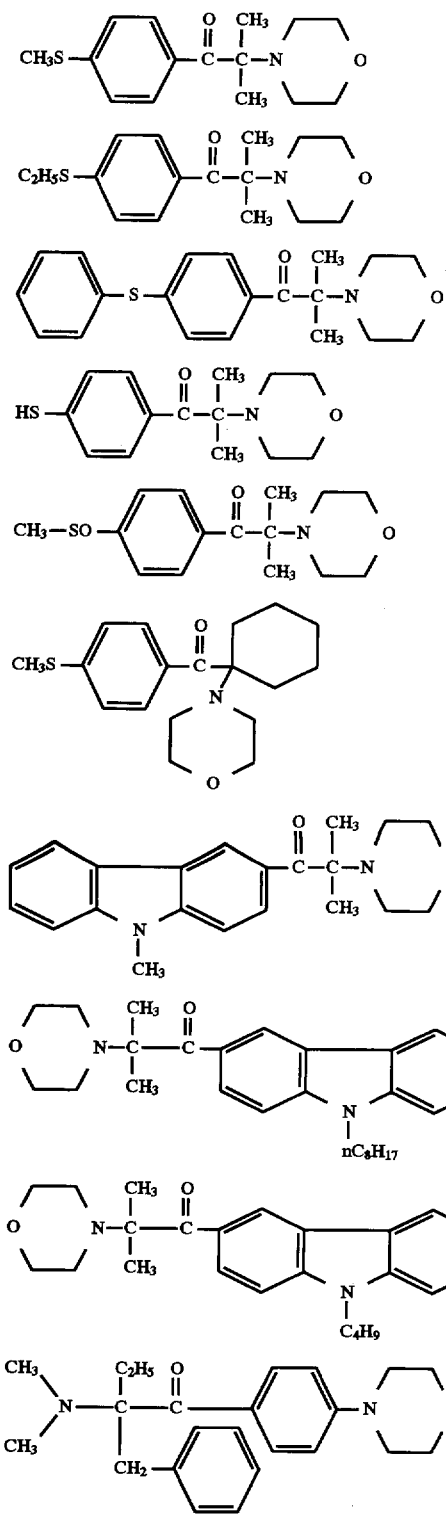

(II-1)

(II-2)

(II-3)

(II-4)

(II-5)

(II-6)

(II-7)

(II-8)

(II-9)

(II-10)

The ketooxime compound represented by formula (III) as component 3) for use in the present invention is described below.

In formula (III), $R^{12}$ and $R^{13}$, which may be the same or different, each represents a hydrocarbon group which may have a substituent or may contain an unsaturated bond or a heterocyclic ring, $R^{14}$ and $R^{15}$, which may be the same or different, each represents a hydrogen atom, a hydrocarbon group which may have a substituent or may contain an unsaturated bond, a heterocyclic group, a hydroxyl group, a substituted oxy group, a mercapto group or a substituted thio group or $R^{14}$ and $R^{15}$ may be combined with each other to form a ring and represent an alkylene group having from 2 to 8 carbon atoms which may contain —O—, —$NR^{16}$—, —O—CO—, —NH—CO—, —S— or —$SO_2$— in the linking main chain of the ring, and $R^{16}$ and $R^{17}$ each represents a hydrogen atom, a hydrocarbon group which may have a substituent or may contain an unsaturated bond or a substituted carbonyl group.
Specific examples of the ketooxime compound include the following compounds but the present invention is by no means limited to these.
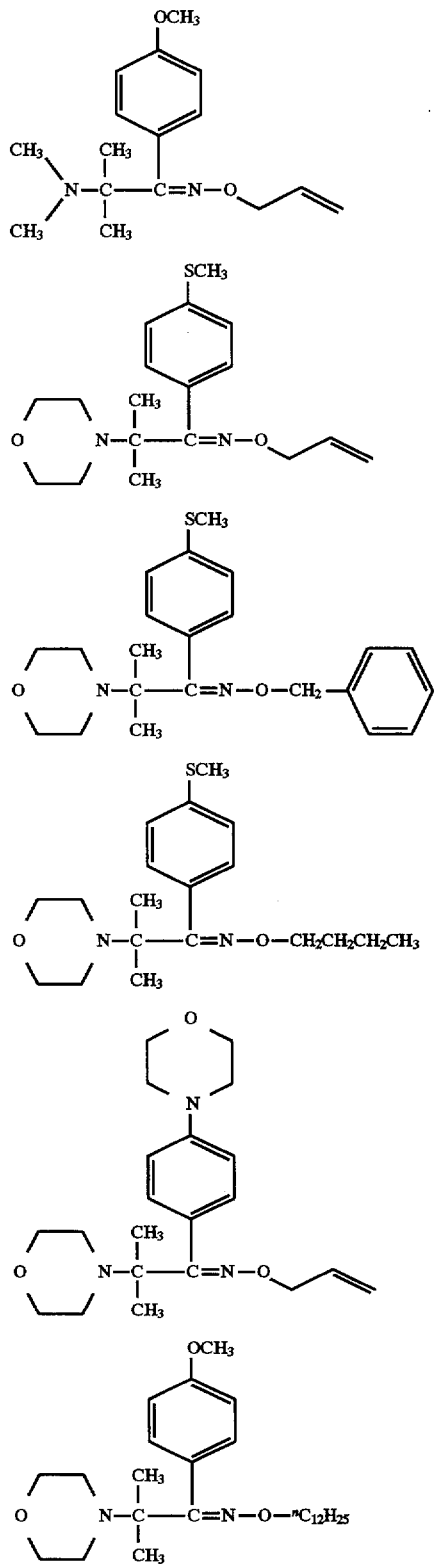
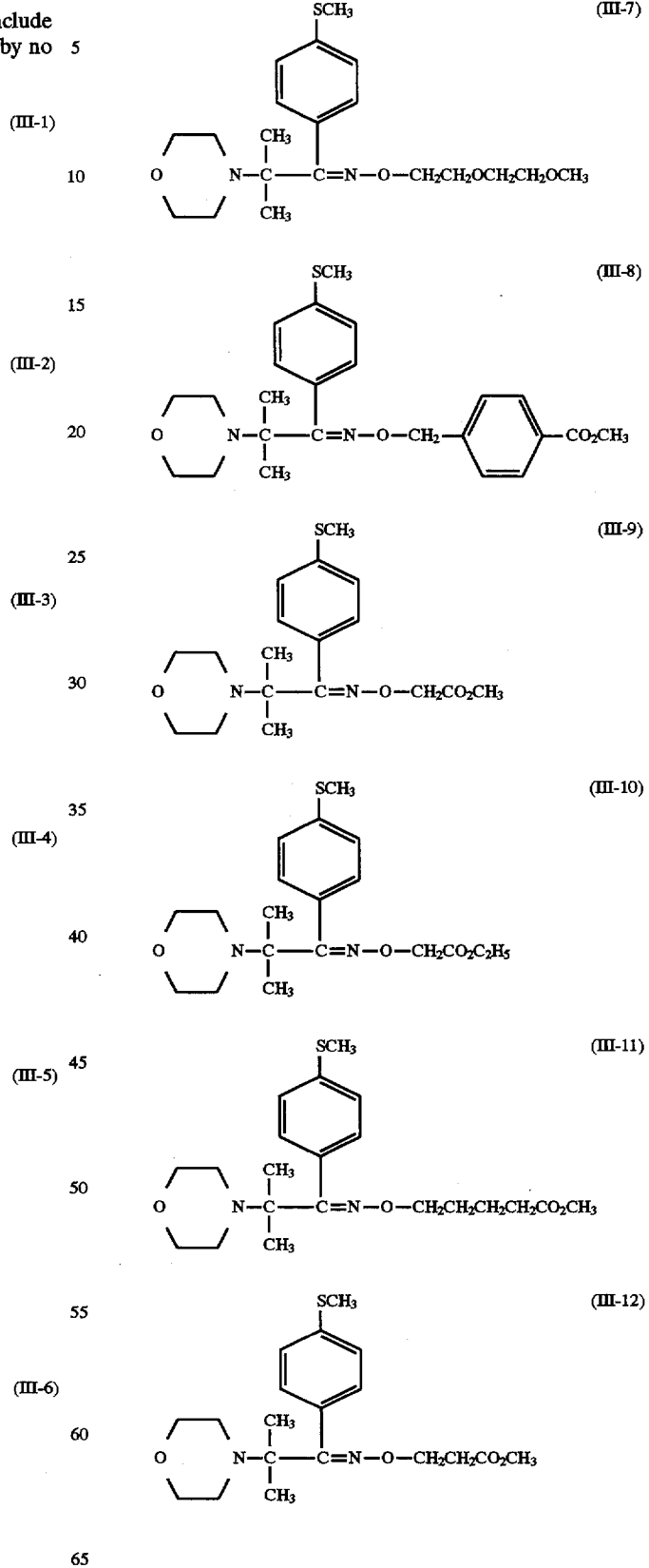

-continued

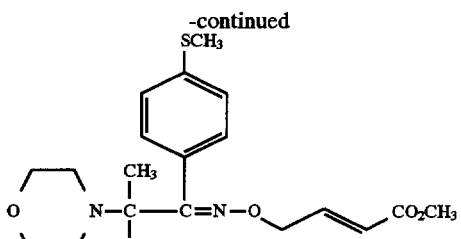

(III-13)

(III-14)

The organic peroxide as component 4) for use in the present invention includes compounds having an oxygen-oxygen bond in the molecule. Examples thereof include methyl ethyl ketone peroxide, cyclohexanone peroxide, 3,3, 5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butyl-peroxy) cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-dimethyl-2,5-di(tert-butylperoxy) hexine-3, acetyl peroxide, isobutyryl peroxide, octanoyl peroxide, decanoyl peroxide, lauloyl peroxide, 3,5,5-trimethylhexanoyl peroxide, succinic peroxide, benzoyl peroxide, 2,4-dichlorobenzoyl peroxide, metatoluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tert-butyl peroxybenzoate, di-tert-butyl peroxyisophthalate, 2,5-dimethyl-2,5-di(benzoylperoxy)hexane, tert-butyl peroxymaleate, tert-butyl peroxyisopropylcarbonate, 3,3',4, 4'-tetra-(t-butylperoxycarbonyl)benzophenone, 3,3',4,4'-tetra-(t-aminoperoxycarbonyl)benzophenone, 3,3',4,4'-tetra-(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone, carbonyldi (t-butylperoxy dihydrogen diphthalate) and carbonyldi(t-hexylperoxy dihydrogen diphthalate).

Among these, preferred are ester peroxides such as 3,3', 4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-t-butyl diperoxyisophthalate.

The thio compound as component 5) represented by formula (IV) is described below.

The alkyl group for $R^{18}$ or $R^{19}$ in formula (IV) is preferably an alkyl group having from 1 to 4 carbon atoms.

The aryl group for $R^{18}$ is preferably an aryl group having from 6 to 10 carbon atoms such as phenyl and naphthyl, and the substituted aryl group includes the above-described aryl group substituted by a halogen atom such as chlorine, an alkyl group such as methyl or an alkoxy group such as methoxy or ethoxy.

Specific examples of the thio compound represented by formula (IV) include the compounds shown in Table 3 below.

TABLE 3

| No. | $R^{18}$ | $R^{19}$ |
|---|---|---|
| 1 | H | H |
| 2 | H | $CH_3$ |
| 3 | $CH_3$ | H |
| 4 | $CH_3$ | $CH_3$ |
| 5 | $C_6H_5$ | $C_2H_5$ |
| 6 | $C_6H_5$ | $C_4H_9$ |
| 7 | $C_6H_4Cl$ | $CH_3$ |
| 8 | $C_6H_4Cl$ | $C_4H_9$ |
| 9 | $C_6H_4$—$CH_3$ | $C_4H_9$ |
| 10 | $C_6H_4$—$OCH_3$ | $CH_3$ |
| 11 | $C_6H_4$—$OCH_3$ | $C_2H_5$ |
| 12 | $C_6H_4$—$OC_2H_5$ | $CH_3$ |
| 13 | $C_6H_4$—$OC_2H_5$ | $C_2H_5$ |
| 14 | $C_6H_4$—$OCH_3$ | $C_4H_9$ |
| 15 | —$(CH_2)_3$— | |
| 16 | —$(CH_2)_2$—S— | |
| 17 | —CH($CH_3$)—$CH_2$—S— | |
| 18 | —$CH_2$—CH($CH_3$)—S— | |
| 19 | —C($CH_3$)$_2$—$CH_2$—S— | |
| 20 | —$CH_2$—C($CH_3$)$_2$—S— | |
| 21 | —$(CH_2)_2$—O— | |
| 22 | —CH($CH_3$)—$CH_2$—O— | |
| 23 | —C($CH_3$)$_2$—$CH_2$—O— | |
| 24 | —CH=CH—N($CH_3$)— | |
| 25 | —$(CH_2)_3$—S— | |
| 26 | —$(CH_2)_2$CH($CH_3$)—S— | |
| 27 | —$(CH_2)_3$—O— | |
| 28 | —$(CH_2)_5$— | |
| 29 | —$C_6C_4$—O— | |
| 30 | —N=C($SCH_3$)—S— | |
| 31 | —$C_6H_4$—NH— | |

| No. | $R^{18}$ | $R^{19}$ |
|---|---|---|
| 32 | 4-Cl-C6H4-O— | |
| 33 | 4-CH3O-C6H4-NH— | |
| 34 | 2-CH3-C6H4-NH— | |
| 35 | 2,5-(CH3)2-C6H3-NH— | |
| 36 | 4-(C5H11C(O)NH)-C6H4-NH— | |

| No. | R¹⁸ | R¹⁹ |
|---|---|---|
| 37 | | (4-Cl, 2-NH—) phenyl |
| 38 | | 2-methyl-1-naphthyl-NH— |
| 39 | | Et₂N-C(=N—)— |
| 40 | C₅H₁₁—C(=O)—NH— | (4-methyl-2-S—) phenyl |
| 41 | | (2-methyl) phenyl-S— |
| 42 | | (4-Cl, 2-methyl) phenyl-S— |
| 43 | | (4-CH₃, 2-methyl) phenyl-S— |

Examples of the hexaarylbiimidazole as component 6) for use in the present invention include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

The aromatic onium salt as component 7) for use in the present invention includes an aromatic onium salt of elements belonging to Groups 15, 16 and 17 of the Periodic Table, specifically, an onium salt of N, P, As, Sb, Bi, O, S, Se, Te and I. Examples of the aromatic onium salt include the compounds described in JP-B-52-14277, JP-B-52-14278 and JP-B-52-14279. Specific examples thereof include the following compounds.

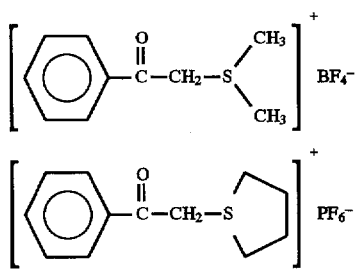

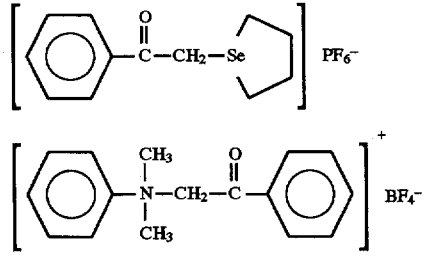

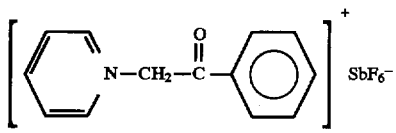

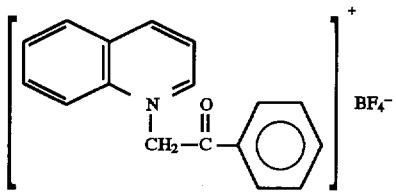

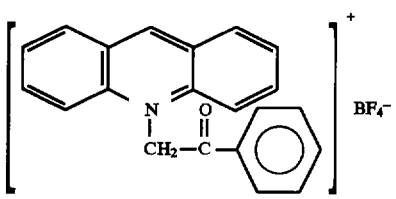

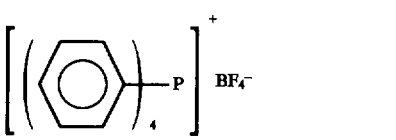

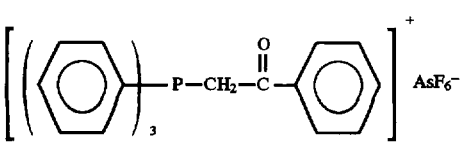

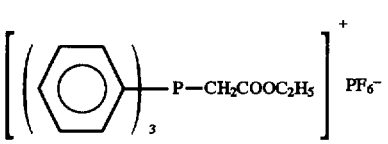

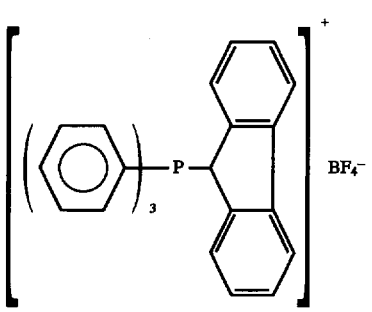

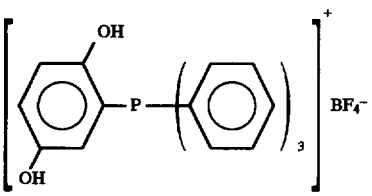

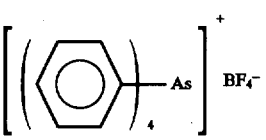

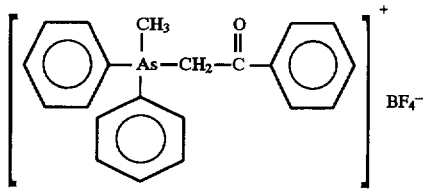

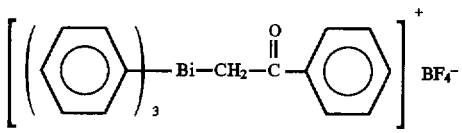

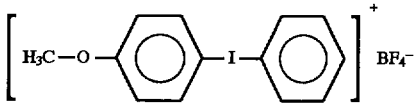

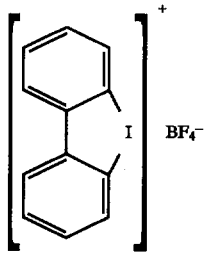

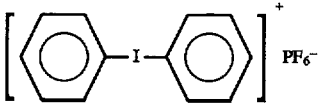

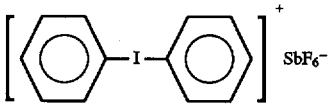

Among these, preferred are compounds of $BF_4$ salt and $PF_6$ salt, more preferred are a $BF_4$ salt and a $PF_6$ salt of aromatic iodonium salts.

Examples of the ketooxime ester as component 8) for use in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

These additives 1) to 8) may be used individually or in combination of two or more thereof. The use amount is suitable from 0.05 to 100 parts by weight, preferably from 1 to 80 parts by weight, more preferably from 3 to 50 parts by weight, per 100 parts by weight of the ethylenically unsaturated compound as component (a).

The composition of the present invention contains the above-described photopolymerization initiation system usually in a very low concentration. If the system is contained in an excessively large concentration, disadvantageous results come out such as cutting of effective light rays. The photopolymerization initiation system of the present invention is preferably used in an amount of from 0.01 to 60 wt %, more preferably for obtaining good results of from 1 to 30 wt %, based on the total amount of the photopolymerizable ethylenically unsaturated compound and a linear organic high molecular polymer which is added if desired.

The photopolymerizable composition of the present invention preferably contains a linear organic high molecular polymer as a binder. The "linear organic high molecular polymer" may be any polymer as long as it is a linear organic high molecular polymer having compatibility with the photo-polymerizable ethylenically unsaturated compound. Preferably, a water- or alkalescent water-soluble or swellable linear organic high molecular polymer capable of water development or alkalescent water development is selected. The linear organic high molecular polymer is used not only as a film forming agent of the composition but also as a water, alkalescent water or organic solvent developer which is appropriately selected depending on the use. For example, when a water-soluble organic high molecular polymer is used, water development can be carried out. This kind of a linear organic high molecular polymer includes an addition polymer having a carboxylic acid group on the side chain and examples thereof include a methacrylic acid copolymer, an acrylic acid copolymer, an itaconic acid copolymer, a crotonic acid copolymer, a maleic acid copolymer and a partially esterified maleic acid copolymer described in JP-A-59-44615, JP-B-54-34327, JP-B-58-12577, JP-B-54-25957, JP-A-54-92723, JP-A-59-53836 and JP-A-59-71048. Further, an acidic cellulose derivative having a carboxylic acid group similarly on the side chain is included. An addition product of a cyclic acid anhydride to the addition polymer having a hydroxyl group may also be useful.

Among these, a [benzyl(meth)acrylate/(meth)acrylic acid/other addition polymerizable vinyl monomer, if desired] copolymer and an [allyl(meth)acrylate/(meth)acrylic acid/other addition polymerizable vinyl monomer, if desired] copolymer are preferred. In addition, polyvinyl pyrrolidone and polyethylene oxide are useful as the water-soluble linear organic polymer. Further, an alcohol-soluble polyamide and a polyether of 2,2-bis(4-hydroxyphenyl)propane with epichlorohydrin are also useful so as to increase the strength of the cured film. The above-described linear organic high molecular polymer can be mixed into the entire composition in any optional amount. However, if the mixing amount exceeds 90 wt %, disadvantageous results may be caused in view of the strength of an image formed and the like. The mixing amount is preferably from 30 to 85%. The weight ratio of the photopolymerizable ethylenically unsaturated compound to the linear organic high molecular polymer is preferably from 1/9 to 7/3, more preferably from 3/7 to 5/5.

In the present invention, in addition to the above-described fundamental components, a slight amount of a heat polymerization inhibitor is preferably added so as to prevent unnecessary heat polymerization of the polymerizable ethylenically unsaturated compound during the production or storage of the photosensitive composition. Suitable examples of the heat polymerization inhibitor include hydroquinone, p-methoxyphenol, di-t-butyl-p-cresol, pyrogallol, t-butyl-catechol, benzoquinone, 4,4'-thiobis(3-methyl-6-t-butylphenol), 2,2'-methylenebis(4-methyl-6-t-butylphenol) and N-nitrosophenylhydroxylamine primary cerium salt. The addition amount of the heat polymerization inhibitor is preferably from about 0.01 to about 5 wt % based on the weight of the entire composition. Also, if desired, a higher fatty acid derivative such as a behenic acid and a behenic acid amide may be added to disperse unevenly on the surface of the photosensitive layer during the drying process after coating so as to prevent the polymerization inhibition due to oxygen. The addition amount of the higher fatty acid derivative is preferably from about 0.5 to about 10 wt % of the entire composition. Further, a dye or a pigment may be added for the purpose of coloring the photosensitive layer. Examples of the coloring agent include a pigment such as a phthalocyanine-based pigment, an azo-based pigment, carbon black and titanium oxide, Ethyl Violet, Crystal Violet, an azo-based dye, an anthraquinone-based dye and a cyanine-based dye. The addition amount of the dye or the pigment is preferably from about 0.5 to about 5 wt % of the entire composition. Also, a filler or other known additives such as a plasticizer may be added so as to improve physical properties of the cured film.

Examples of the plasticizer include dioctyl phthalate, didodecyl phthalate, triethylene glycol caprylate, dimethyl glycol phthalate, tricresyl phosphate, dioctyl adipate, dibutyl sebacate and triacetyl glycerine and when a binder is used, the plasticizer may be added in an amount of 10% or less based on the total weight of the ethylenically unsaturated compound (a) and the binder.

The photopolymerizable composition of the present invention is dissolved in various organic solvents and then coated on a support. Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50 wt %.

The coverage of the coating solution is in terms of the weight after drying preferably from about 0.1 to about 10 $g/m^2$, more preferably from 0.5 to 5 $g/m^2$.

As the above-described support, a dimensionally stable, plate-like material is used. Examples of the dimensionally stable, plate-like material include paper, paper laminated with plastics (e.g., polyethylene, polypropylene, polystyrene), sheet of a metal such as aluminum (including aluminum alloy), zinc and copper, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal, and paper or plastic film laminated with or having evaporated thereon the above-described metal. Among these supports, an aluminum plate is particularly preferred because it is dimensionally stable to an extreme extent and in addition, cheap. Also, a composite sheet obtained by bonding an aluminum sheet on a polyethylene terephthalate film described in JP-B-48-18327 may be preferably used.

A support having a metal, particularly an aluminum surface is preferably subjected to surface treatment such as graining treatment, dipping treatment in an aqueous solution of sodium silicate, potassium fluorozirconate or phosphate, or anodic oxidation treatment.

Further, an aluminum plate subjected to graining and then to dipping treatment in an aqueous solution of sodium silicate may be preferably used. An aluminum plate subjected to anodic oxidation treatment and then to dipping treatment in an aqueous solution of alkali metal silicate described in JP-B-47-5125 may be suitably used. The above-described anodic oxidation treatment is carried out by applying current to the aluminum plate as an anode in an electrolyte, for example, in an aqueous or non-aqueous solution of an inorganic acid such as phosphoric acid, chromic acid, sulfuric acid or boric acid or of an organic acid such as oxalic acid or sulfamic acid, which solutions may be used individually or in combination of two or more thereof.

The silicate electrodeposition described in U.S. Pat. No. 3,658,662 is also effective.

Also, it is useful to apply a surface treatment comprising a combination of the above-described anodic oxidation treatment and sodium silicate treatment to a support subjected to electrolysis graining as disclosed in JP-B-46-27481, JP-A-52-58602 and JP-A-52-30503.

Further, a support subjected in sequence to mechanical graining, chemical etching, electrolysis graining, anodic oxidation treatment and sodium silicate treatment as disclosed in JP-A-56-28893 is preferred.

Furthermore, a support may be suitably subjected, after the above-described treatments, to undercoating by a water-soluble resin such as a polymer or copolymer having a polyvinyl phosphonic acid or a sulfonic acid on the side chain or a polyacrylic acid, a water-soluble metal salt (e.g., zinc borate), a yellow dye or an amine salt.

Still further, a sol-gel treated substrate having conjugation-bonded thereto a functional group capable of addition reaction by radicals described in JP-A-7-159983 may be suitably used.

The above-described treatments to achieve hydrophilicity are effected not only to render the support surface hydrophilic but also to prevent harmful reaction of the photopolymerizable composition to be coated on the support and at the same time, to improve the adhesion to the photosensitive layer.

In order to prevent polymerization inhibition action of the oxygen in air, a protective layer comprising a polymer having an excellent oxygen cutting property, such as polyvinyl alcohol, in particular, polyvinyl alcohol having a saponification degree of 99% or more, or an acidic cellulose, may be provided on the photopolymerizable composition layer on the support. The coating method of the protective layer is described in detail, for example, in U.S. Pat. No. 3,458,311 and JP-A-55-49729.

The photopolymerizable composition of the present invention can be used for usual photopolymerization. Further, the composition can be used in various fields, for example, as a photoresist in producing a printing plate or a printed board. In particular, since the photopolymerizable composition of the present invention has such properties as high sensitivity and wide spectral sensitivity extending even to a visible light region, it can provide good effects when it is applied to a photosensitive material for a visible light laser such as an $Ar^+$ laser or a YAG-SHG laser.

The photosensitive material using the photopolymerizable composition of the present invention is subjected to image exposure and then the unexposed area of the photosensitive layer is removed by a developer to obtain an image. In using the photopolymerizable composition for producing a lithographic printing plate, the developer described in JP-B-57-7427 is preferred and an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia or of an organic alkali agent such as monoethanolamine or diethanolamine is suitably used. The alkali agent is added to give a concentration of from 0.1 to 10 wt %, preferably from 0.5 to 5 wt %.

The above-described alkaline aqueous solution may contain, if desired, a surface active agent or an organic solvent such as benzyl alcohol, 2-phenoxyethanol or 2-butoxyethanol, in a small amount. Examples thereof include those described in U.S. Pat. Nos. 3,375,171 and 3,615,480.

Further, the developers described in JP-A-50-26601, JP-A-58-54341, JP-B-56-39464 and JP-B-56-42860 are also excellent.

The photopolymerizable composition of the present invention exhibits high sensitivity to active light rays over a wide region of from ultraviolet light to visible light. Accordingly, the light source may be an ultrahigh-pressure mercury lamp, a high-pressure mercury lamp, a medium-pressure mercury lamp or a low-pressure mercury lamp, a chemical lamp, a carbon arc lamp, a xenon lamp, a metal halide lamp, visible, ultraviolet or other various laser lamps, a fluorescent lamp, a tungsten lamp or sunlight.

The present invention will be described below in greater detail by referring to the examples, but the present invention should not be construed as being limited to these examples.

EXAMPLES 1 TO 16 AND COMPARATIVE EXAMPLES 1 TO 7

A 0.30 mm-thick aluminum plate was subjected to the graining of the surface thereof using a nylon blush and a water suspension of 400-mesh pumice stones and then well washed with water. After dipping in a 10% sodium hydroxide at 70° C. for 60 seconds to effect etching, the plate was washed with flowing water, neutralization-washed with a 20% nitric acid and then washed with water. The resulting plate was subjected to electrolysis graining treatment using a sinewaveform alternating current under conditions of $V_A=12.7$ V in a 1% aqueous nitric acid solution at an anode electricity quantity of 160 coulomb/$dm^2$. The surface roughness measured was 0.6μ (Ra indication). Subsequently, the plate was dipped in a 30% aqueous sulfuric acid solution to effect desmutting at 55° C. for 2 minutes and then subjected to anodic oxidation treatment in a 20% aqueous sulfuric acid solution at a current density of 2 A/$dm^2$ for 2 minutes to give an anodic oxidation film thickness of 2.7 g/$m^2$.

A photosensitive composition having the following composition was coated on the thus-treated aluminum plate to give a dry coating weight of 1.4 g/$m^2$ and then dried at 80° C. for 2 minutes to form a photosensitive layer.

| | |
|---|---|
| Pentaerythritol tetraacrylate | 1.5 g |
| Allyl methacrylate/methacrylic acid copolymer (copolymerization molar ratio: 80/20) | 2.0 g |
| Photopolymerization initiation system | X g |
| Fluorine-based nonionic surface active agent | 0.03 g |
| Methyl ethyl ketone | 20 g |
| Propylene glycol monomethyl ether acetate | 20 g |

On the thus-provided photosensitive layer, a 3 wt % aqueous solution of polyvinyl alcohol (saponification degree: 86.5–89 mol %, polymerization degree: 1,000) was coated to give a dry coating weight of 2 g/$m^2$ and dried at 100° C. for 2 minutes.

The photosensitivity test was conducted to visible light.

The visible light used was a monochromatic light from a xenon lamp as a light source through Kenko Optical Filter BP-49.

The photosensitivity was determined using FUJI PS Step Guide (a step tablet having 15 stages, manufactured by Fuji Photo Film Co., Ltd., in which the transmission optical density is 0.05 at the initial stage and increased in sequence by 0.15). The sensitivity was shown by the clear stage number of the PS step guide at the time when exposed at the illuminance on the photosensitive layer surface of 0.0132 mW/cm$^2$ for 240 seconds.

Thereafter, the plate was heated at 100° C. for 1 minute and dipped in the following developer at 25° C. for 1 minutes to effect development.

| | |
|---|---|
| 1K Potassium silicate | 30 g |
| Potassium hydroxide | 15 g |
| $C_{12}H_{25}$—$C_6H_4$—O—$C_6H_4$—$SO_3Na$ | 3 g |
| Water | 1,000 g |

The sensitivity was measured using the following compound as a photopolymerization initiation system by varying the combination in the system and the results obtained are shown in Table 4. The numerals in parenthesis are in a unit of g.

TABLE 4

| Example No. | Sensitizing Dye | Titanocene Compound | Gray Scale Stage Number (Clear) |
|---|---|---|---|
| Example | | | |
| 1 | I-1 (0.080) | A-1 (0.1) | 6 |
| 2 | I-7 (0.080) | A-1 (0.1) | 7 |
| 3 | I-10 (0.080) | A-1 (0.1) | 6 |
| 4 | I-73 (0.080) | A-1 (0.1) | 6 |
| 5 | I-74 (0.080) | A-1 (0.1) | 7 |
| 6 | I-24 (0.080) | A-1 (0.1) | 8 |
| 7 | I-29 (0.080) | A-1 (0.1) | 6 |
| 8 | I-70 (0.080) | A-1 (0.1) | 8 |
| 9 | I-7 (0.080) | A-2 (0.1) | 7 |
| 10 | I-73 (0.080) | A-2 (0.1) | 5 |
| 11 | I-29 (0.080) | A-2 (0.1) | 6 |
| 12 | I-74 (0.080) | A-2 (0.1) | 6 |
| 13 | I-7 (0.080) | A-3 (0.1) | 8 |
| 14 | I-73 (0.080) | A-3 (0.1) | 8 |
| 15 | I-29 (0.080) | A-3 (0.1) | 6 |
| 16 | I-74 (0.080) | A-3 (0.1) | 7 |
| Comparative Example | | | |
| 1 | I-7 (0.080) | — | 0 |
| 2 | I-73 (0.080) | — | 0 |
| 3 | I-29 (0.080) | — | 0 |
| 4 | I-74 (0.080) | — | 0 |
| 5 | — | A-1 (0.1) | 0 |
| 6 | — | A-2 (0.1) | 0 |
| 7 | — | A-3 (0.1) | 0 |

EXAMPLES 17 TO 50

Samples were prepared thoroughly in the same manner as in Example 1 except for changing the photopolymerization initiation system in Example 1 to the compounds described in Table 5 below and each sample was tested on the sensitivity in the same manner as in Example 1. The results obtained are shown in Table 5 below.

TABLE 5

| Example No. | Sensitizing Dye | | Titanocene Compound | | Compounds 1) to 8) | | Gray Scale Stage Number (Clear) |
|---|---|---|---|---|---|---|---|
| 17 | I-73 | (0.08) | A-1 | (0.1) | 1)-1 | (0.2) | 8 |
| 18 | I-73 | (0.1) | A-1 | (0.15) | 1)-2 | (0.3) | 9 |
| 19 | I-73 | (0.15) | A-1 | (0.2) | 1)-3 | (0.2) | 9 |
| 20 | I-73 | (0.08) | A-1 | (0.1) | 1)-4 | (0.2) | 7 |
| 21 | I-73 | (0.08) | A-1 | (0.1) | II-1 | (0.2) | 9 |
| 22 | I-73 | (0.08) | A-1 | (0.2) | II-7 | (0.3) | 10 |
| 23 | I-73 | (0.08) | A-1 | (0.1) | III-6 | (0.1) | 9 |
| 24 | I-73 | (0.15) | A-1 | (0.15) | III-9 | (0.25) | 10 |
| 25 | I-73 | (0.1) | A-1 | (0.1) | 4)-1 | (0.30) | 9 |
| 26 | I-73 | (0.1) | A-1 | (0.2) | 5)-1 | (0.4) | 10 |
| 27 | I-73 | (0.1) | A-1 | (0.15) | 5)-2 | (0.3) | 10 |
| 28 | I-73 | (0.1) | A-1 | (0.2) | 7)-1 | (0.2) | 8 |
| 29 | I-73 | (0.1) | A-1 | (0.1) | 6)-1 | (0.5) | 11 |
| 30 | I-73 | (0.1) | A-1 | (0.1) | 8)-1 | (0.2) | 7 |
| 31 | I-1 | (0.15) | A-2 | (0.1) | II-1 | (0.3) | 8 |
| 32 | I-7 | (0.15) | A-3 | (0.2) | II-7 | (0.2) | 9 |
| 33 | I-74 | (0.1) | A-3 | (0.2) | III-6 | (0.4) | 9 |
| 34 | I-70 | (0.15) | A-2 | (0.15) | 5)-1 | (0.4) | 10 |
| 35 | I-24 | (0.08) | A-3 | (0.1) | III-9 | (0.2) | 9 |
| 36 | I-72 | (0.2) | A-2 | (0.2) | 1)-3 | (0.2) | 9 |
| 37 | I-29 | (0.08) | A-2 | (0.2) | 1)-3 | (0.2) | 9 |
| 38 | I-74 | (0.08) | A-2 | (0.3) | 5)-2 | (0.3) | 9 |
| 39 | I-1 | (0.1) | A-3 | (0.15) | III-1 | (0.2) | 9 |
| 40 | I-7 | (0.1) | A-3 | (0.15) | III-9 | (0.3) | 10 |
| 41 | I-10 | (0.1) | A-2 | (0.15) | III-5 | (0.3) | 8 |
| 42 | I-11 | (0.15) | A-3 | (0.2) | III-3 | (0.3) | 8 |
| 43 | I-74 | (0.08) | A-2 | (0.15) | III-6 | (0.3) | 9 |
| 44 | I-74 | (0.08) | A-3 | (0.15) | 5)-3 | (0.5) | 9 |
| 45 | I-74 | (0.15) | A-2 | (0.3) | 7)-1 | (0.4) | 8 |
| 46 | I-1 | (0.1) | A-1 | (0.3) | 1)-2 | (0.8) | 10 |
| 47 | I-29 | (0.1) | A-3 | (0.2) | II-1 | (0.4) | 10 |
| 48 | I-29 | (0.1) | A-3 | (0.2) | III-9 | (0.4) | 10 |
| 49 | I-24 | (0.1) | A-3 | (0.2) | 6)-1 | (0.6) | 10 |
| 50 | I-38 | (0.1) | A-3 | (0.2) | 5)-2 | (0.5) | 10 |

1)-1: 2-(p-Styrylphenyl)-4,6-bis(trichloromethyl)-S-triazine
1)-2: 2-Phenyl-4,6-bis(trichloromethyl)-S-triazine
1)-3: 2-(p-Trifluoromethylphenyl)-4,6-bis(trichloromethyl)-S-triazine
1)-4: 2-Dichloromethyl-5-phenyl-1,3,4-oxadiazole
4)-1: 3,3',4,4'-Tetra-(t-butylperoxycarbonyl)benzophenone
5)-1: 2-Mercaptobenzothiazole
5)-2: 2-Mercapto-5-methoxybenzimidazole
5)-3: 2-Mercapto-5-benzimidazole
6)-1: 2,2'-Bis(o-chlorophenyl)-4,4',5,5'-tetraphenylbiimidazole
6)-2: 2,2'-Bis(o,p-dichlorophenyl)-4,4',5,5'-tetraphenylbiimidazole
7)-1: Diphenyl iodonium hexafluoro phosphate
8)-1: 3-Benzoyloxyiminobutan-2-one It is seen from the results in Tables 4 and 5 that samples using the photopolymerizable composition of the present invention which contains a sensitizing dye represented by formula (I) and a titanocene compound as a photopolymerization initiation system showed high sensitivity and samples using the photopolymerization initiation system which further contains at least one of compounds 1) to 8) showed still higher sensitivity.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising: (a) an addition polymerizable compound having at least one ethylenically unsaturated double bond; (b) a sensitizing dye represented by the following formula (I); and (c) a titanocene compound:

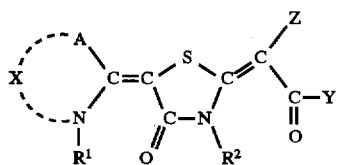

(I)

wherein $R^1$ and $R^2$, which are the same or optionally are different, each represents a hydrogen atom, an alkyl group, a substituted alkyl group, an alkenyl group, a substituted alkenyl group, an alkoxycarbonyl group, an aryl group, a substituted aryl group, an alkynyl group or a substituted alkynyl group;

A represents an oxygen atom, a sulfur atom, a carbon atom substituted by an alkyl group or an aryl group or a carbon atom substituted by two alkyl groups;

X represents a nonmetallic atom group necessary for forming a nitrogen-containing heterocyclic 5-membered ring;

Y represents a phenyl group, a substituted phenyl group or an unsubstituted or substituted heteroaromatic ring;

Z represents a hydrogen atom, an alkyl group, a substituted alkyl group, an aryl group, a substituted aryl group, an alkoxy group, an alkylthio group, an arylthio group, a substituted amino group, an acyl group or an alkoxycarbonyl group; and Z and Y optionally are combined with each other to form a ring.

2. A photopolymerizable composition as claimed in claim 1, further comprising at least one compound selected from the group consisting of the compounds 1) to 8):

1) a compound having a carbon-halogen bond;

2) a ketone compound represented by the following formula (II):

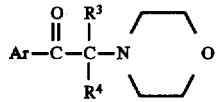

(II)

wherein Ar represents an aromatic group selected from those represented by the following formulae:

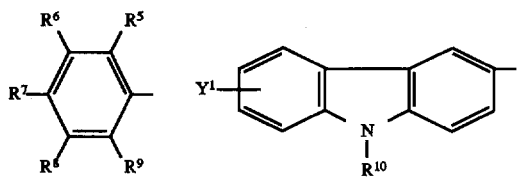

wherein $R^5$, $R^6$, $R^7$, $R^8$, and $R^9$, which are the same or optionally are different, each represents a hydrogen atom, a halogen atom, an alkyl group, an alkenyl group, an aryl group, a substituted aryl group, a hydroxyl group, an alkoxy group, an —S—$R^{11}$ group, an —SO—$R^{11}$ group or an —SO$_2$—$R^{11}$ group, provided that at least one of $R^5$, $R^6$, $R^7$, $R^8$ and $R^9$ represents an —S—$R^{11}$ or —SO—$R^{11}$ group wherein $R^{11}$ represents an alkyl group, or an alkenyl group; $R^{10}$ represents a hydrogen atom, an alkyl group or an acyl group and $Y^1$ represents a hydrogen atom or

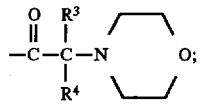

$R^3$ and $R^4$ each represents a hydrogen atom or an alkyl group and $R^3$ and $R^4$ optionally are combined with each other to represent an alkylene group;

3) a ketooxime compound represented by the following formula (III):

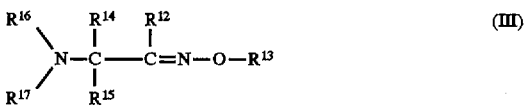

(III)

wherein $R^{12}$ and $R^{13}$, which are the same or optionally are different, each represents a hydrocarbon group which optionally has a substituent or optionally contains an unsaturated bond or a heterocyclic ring;

$R^{14}$ and $R^{15}$, which are the same or optionally are different, each represents a hydrogen atom, a hydrocarbon group which optionally has a substituent or optionally contains an unsaturated bond, a heterocyclic group, a hydroxyl group, a substituted oxy group, a mercapto group or a substituted thio group, and $R^{14}$ and $R^{15}$ optionally are combined with each other to form a ring and represent an alkylene group having from 2 to 8 carbon atoms which optionally contains any of —O—, —NR$^{16}$—, —O—CO—, —NH—CO—, —S— or —SO$_2$— in the linking main chain of the ring; and $R^{16}$ and $R^{17}$ each represents a hydrogen atom, a hydrocarbon group which optionally has a substituent or optionally contains an unsaturated bond or a substituted carbonyl group;

4) an organic peroxide;

5) a thio compound represented by formula (IV):

(IV)

wherein $R^{18}$ represents an alkyl group, an aryl group or a substituted aryl group and $R^{19}$ represents a hydrogen atom or an alkyl group, or $R^{18}$ and $R^{19}$ optionally are combined with each other to represent a nonmetallic atom group necessary for forming a 5-, 6- or 7-membered ring which optionally contains a hetero atom selected from an oxygen atom, a sulfur atom and a nitrogen atom;

6) hexaarylbiimidazole;

7) an aromatic onium salt; and 8) a ketooxime ester.

3. A photopolymerizable composition as claimed in claim 1, wherein said sensitizing dye is used in an amount of from 0.05 to 30 parts by weight per 100 parts by weight of the addition polymerizable compound having at least one ethylenically unsaturated double bond.

4. A photopolymerizable composition as claimed in claim 1, wherein said sensitizing dye is used in an amount of from 0.1 to 20 parts by weight per 100 parts by weight of the addition polymerizable compound having at least one ethylenically unsaturated double bond.

5. A photopolymerizable composition as claimed in claim 1, wherein said sensitizing dye is used in an amount of from 0.2 to 10 parts by weight per 100 parts by weight of the addition polymerizable compound having at least one ethylenically unsaturated double bond.

6. A photopolymerizable composition as claimed in claim 1, wherein said titanocene compound is used in an amount of from 0.5 to 100 parts by weight per 100 parts by weight of the addition polymerizable compound having at least one ethylenically unsaturated double bond.

7. A photopolymerizable composition as claimed in claim 1, wherein said titanocene compound is used in an amount of from 1 to 80 parts by weight per 100 parts by weight of the addition polymerizable compound having at least one ethylenically unsaturated double bond.

8. A photopolymerizable composition as claimed in claim 1, wherein said titanocene compound is used in an amount of from 2 to 50 parts by weight per 100 parts by weight of the addition polymerizable compound having at least one ethylenically unsaturated double bond.

9. A photopolymerizable composition as claimed in claim 1, wherein $R^1$ and $R^2$, which are the same or optionally are different, each represents an alkenyl group, a substituted alkenyl group, an alkoxycarbonyl group, an aryl group, a substituted aryl group, an alkynyl group or a substituted alkynyl group.

10. A photopolymerizable composition as claimed in claim 1, wherein A represents a carbon atom substituted by an alkyl group or an aryl group.

11. A photopolymerizable composition as claimed in claim 1, wherein Y represents a substituted phenyl group or an unsubstituted or substituted heteroaromatic ring.

12. A photopolymerizable composition as claimed in claim 1, wherein Z represents an alkoxy group, an alkylthio group, an arylthio group or a substituted amino group.

13. A photopolymerizable composition as claimed in claim 1, wherein A and X combine to form the following structure having a nitrogen-containing heterocyclic 5-membered ring:

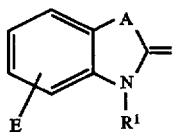

(a-1)

wherein substituent E has a Hammett's σ value of from −0.9 to +0.5.

14. A photopolymerizable composition as claimed in claim 13, wherein substituent E is selected from the group consisting of a hydrogen atom, a methyl group, an isopropyl group, a tert-butyl group, a phenyl group, a trifluoromethyl group, an acetyl group, an ethoxycarbonyl group, a carboxyl group, a carboxylate group, an amino group, a methylamino group, a dimethylamino group, an ethylamino group, a diethylamino group, an acetylamino group, a —PO$_3$H group, a methoxy group, an ethoxy group, a propoxy group, an isopropoxy group, a butoxy group, a benzyloxy group, a phenoxy group, a hydroxy group, an acetoxy group, a methylthio group, an ethylthio group, an isopropylthio group, a mercapto group, an acetylthio group, a thiocyano group, a methylsulfinyl group, an ethylsulfinyl group, a methylsulfonyl group, an ethylsulfonyl group, an aminosulfonyl group, a dimethylsulfonyl group, a sulfonate group, a fluorine atom, a chlorine atom, a bromine atom, an iodine atom, an iodyl group, a trimethylsilyl group, a triethylsilyl group and a trimethylstannyl group.

15. A photopolymerizable composition as claimed in claim 1, wherein A and X combine to form a nitrogen-containing heterocyclic 5-membered ring selected from the group consisting of the following structures:

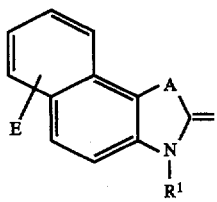

(a-2)

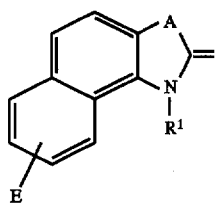

(a-3)

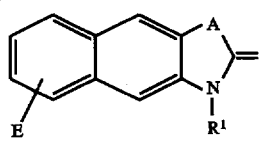

(a-4)

wherein substituent E is selected from the group consisting of a methyl group, an isopropyl group, a tert-butyl group, a phenyl group, a trifluoromethyl group, an acetyl group, an ethoxycarbonyl group, a carboxyl group, a carboxylate group, an amino group, a methylamino group, a dimethylamino group, an ethylamino group, a diethylamino group, an acetylamino group, a —PO$_3$H group, a methoxy group, an ethoxy group, a propoxy group, an isopropoxy group, a butoxy group, a benzyloxy group, a phenoxy group, a hydroxy group, an acetoxy group, a methylthio group, an ethylthio group, an isopropylthio group, a mercapto group, an acetylthio group, a thiocyano group, a methylsulfinyl group, an ethylsulfinyl group, a methylsulfonyl group, an ethylsulfonyl group, an aminosulfonyl group, a dimethylsulfonyl group, a sulfonate group, a fluorine atom, a chlorine atom, a bromine atom, an iodine atom, an iodyl group, a trimethylsilyl group, a triethylsilyl group and a trimethylstannyl group.

16. A photopolymerizable composition as claimed in claim 1, further comprising a ketooxime compound represented by the following formula (III):

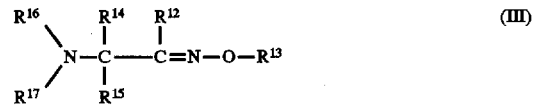

(III)

wherein $R^{12}$ and $R^{13}$, which are the same or optionally are different, each represents a hydrocarbon group which optionally has a substituent or optionally contains an unsaturated bond or a heterocyclic ring;

$R^{14}$ and $R^{15}$, which are the same or optionally are different, each represents a hydrogen atom, a hydrocarbon group which optionally has a substituent or optionally contains an unsaturated bond, a heterocyclic group, a hydroxyl group, a substituted oxy group, a mercapto group or a substituted thio group, and $R^{14}$ and $R^{15}$ optionally are combined with each other to form a ring and represent an alkylene group having from 2 to 8 carbon atoms which optionally contains —O—, —NR$^6$—, —O—CO—, —NH—CO—, —S— or —SO$_2$— in the linking main chain of the ring; and $R^{16}$ and $R^{17}$ each represents a hydrogen atom, a hydrocarbon group which optionally has a substituent or optionally contains an unsaturated bond or a substituted carbonyl group.

* * * * *